United States Patent
Cook et al.

(10) Patent No.: US 8,639,180 B2
(45) Date of Patent: Jan. 28, 2014

(54) VERIFYING AND MITIGATING OSCILLATION IN AMPLIFIERS

(71) Applicant: Wilson Electronics, Inc., St. George, UT (US)

(72) Inventors: Patrick L. Cook, St. George, UT (US); Vernon A. Van Buren, Cedar City, UT (US); Christopher K. Ashworth, St. George, UT (US); Richard M. Kline, Cedar City, UT (US)

(73) Assignee: Wilson Electronics, LLC, St. George, UT (US)

( * ) Notice: Subject to any disclaimer, the term of this patent is extended or adjusted under 35 U.S.C. 154(b) by 0 days.

(21) Appl. No.: 13/837,788

(22) Filed: Mar. 15, 2013

(65) Prior Publication Data

US 2013/0203404 A1   Aug. 8, 2013

Related U.S. Application Data

(63) Continuation-in-part of application No. 13/593,246, filed on Aug. 23, 2012, which is a continuation-in-part of application No. 13/439,148, filed on Apr. 4, 2012.

(60) Provisional application No. 61/526,452, filed on Aug. 23, 2011.

(51) Int. Cl.
*H04B 7/14* (2006.01)

(52) U.S. Cl.
USPC ........................................................ 455/11.1

(58) Field of Classification Search
USPC ................ 455/7, 10, 11.1, 14, 15, 16, 20, 24, 455/234.1, 234.2, 254
See application file for complete search history.

(56) References Cited

U.S. PATENT DOCUMENTS

| | | | |
|---|---|---|---|
| 4,539,527 A | 9/1985 | Ishigaki et al. |
| 4,595,803 A | 6/1986 | Wright |
| 4,731,869 A | 3/1988 | Farrer |
| 5,095,528 A | 3/1992 | Leslie et al. |
| 5,787,336 A | 7/1998 | Hirschfield et al. |
| 5,815,795 A | 9/1998 | Iwai |
| 6,384,681 B1 | 5/2002 | Bonds |
| 6,584,081 B1 | 6/2003 | Lee et al. |
| 6,892,080 B2 | 5/2005 | Friesen et al. |
| 7,184,703 B1 | 2/2007 | Naden et al. |
| 7,233,771 B2 | 6/2007 | Proctor, Jr. et al. |
| 7,245,880 B1 | 7/2007 | Jacobsen |
| 7,409,186 B2 | 8/2008 | Van Buren et al. |
| 7,620,380 B2 | 11/2009 | Hendrix et al. |

(Continued)

OTHER PUBLICATIONS

International Search Report & Written Opinion dated Nov. 6, 2012 as received in application No. PCT/US2012/052144.

(Continued)

*Primary Examiner* — Thanh Le
(74) *Attorney, Agent, or Firm* — Maschoff Brennan

(57) ABSTRACT

A method is provided for detecting and mitigating oscillation in a booster amplifier. The booster amplifier is configured to sample a signal being amplified to determine whether the booster amplifier is oscillating. In addition, the status of the booster amplifier can be verified based on the apparent signal levels of the signals being amplified. The gain of the booster amplifier is then adjusted in accordance with whether the booster amplifier is oscillating or as necessary to maintain gain that is compatible with the system within which the booster amplifier is operating.

20 Claims, 17 Drawing Sheets

(56) References Cited

U.S. PATENT DOCUMENTS

| | | |
|---|---|---|
| 2002/0101936 A1 | 8/2002 | Wright et al. |
| 2003/0123401 A1 | 7/2003 | Dean |
| 2003/0124997 A1 | 7/2003 | Park |
| 2003/0211828 A1 | 11/2003 | Dalgleish et al. |
| 2004/0146013 A1 | 7/2004 | Song et al. |
| 2004/0166802 A1 | 8/2004 | McKay, Sr. et al. |
| 2004/0229586 A1 | 11/2004 | Oshima et al. |
| 2005/0272367 A1 | 12/2005 | Rodgers et al. |
| 2006/0091950 A1 | 5/2006 | Hayase |
| 2006/0209997 A1 | 9/2006 | Van Buren et al. |
| 2007/0071128 A1* | 3/2007 | Meir et al. .................. 375/297 |
| 2007/0197207 A1 | 8/2007 | Carstens et al. |
| 2007/0268827 A1 | 11/2007 | Csaszar et al. |
| 2008/0014862 A1 | 1/2008 | Van Buren et al. |
| 2008/0076437 A1 | 3/2008 | Wilson et al. |
| 2008/0212500 A1 | 9/2008 | Zhen et al. |
| 2008/0293370 A1 | 11/2008 | Wood |
| 2008/0304434 A1 | 12/2008 | Giaretta et al. |
| 2009/0311985 A1 | 12/2009 | Youssoufian et al. |
| 2010/0009646 A1 | 1/2010 | Mevel et al. |
| 2010/0093388 A1 | 4/2010 | Bagchi |
| 2010/0159856 A1 | 6/2010 | Kato et al. |
| 2010/0248751 A1 | 9/2010 | Tsutsui |
| 2010/0321219 A1 | 12/2010 | Li |
| 2011/0105060 A1 | 5/2011 | Kim et al. |
| 2011/0190028 A1 | 8/2011 | Hahn et al. |
| 2011/0217943 A1 | 9/2011 | Ashworth et al. |

OTHER PUBLICATIONS

International Search Report & Written Opinion dated Nov. 2, 2012 as received in application No. PCT/US2012/052155.
U.S. Appl. No. 13/592,079, filed Aug. 22, 2012.
U.S. Appl. No. 13/439,148, filed Apr. 4, 2012.
U.S. Appl. No. 13/593,246, filed Aug. 23, 2012.

* cited by examiner

VERIFYING AND MITIGATING OSCILLATION IN AMPLIFIERS

CROSS REFERENCE TO RELATED APPLICATIONS

This application is a continuation in part of U.S. application Ser. No. 13/593,246 filed on Aug. 23, 2012, which is a continuation in part of U.S. Ser. No. 13/439,148, filed on Apr. 4, 2012, which claims the benefit of U.S. Provisional Application 61/526,452 filed Aug. 23, 2011. The foregoing applications are incorporated by reference in their entireties.

BACKGROUND

Booster amplifiers are bi-directional amplifiers used for increasing the sensitivity and power output of cell phones and other wireless devices that are communicating through them. The use of a booster amplifier, however, may disrupt cellular systems of both the network through which the device is communicating and other cellular networks that the device is not communicating through.

The adverse effects of a booster amplifier can result in a power overload situation, where excessive power overshadows other devices and causes them to be dropped or disconnected. A booster amplifier can also increase the noise floor, which decreases the sensitivity of a base station. Increasing the noise floor often decreases the coverage area of a base station and impairs cellular service. In addition, a booster amplifier may begin to self-oscillate. A condition that results in noise and that can cause interference in the cellular system.

In addition to the disruption of cellular systems, an improperly functioning booster amplifier can cause a wireless device's signal, as received by base stations, to be weaker than necessary. This can result in poor reception of the wireless device's signal by base stations. Under certain conditions, this could even inhibit a wireless device from placing or receiving calls.

With the introduction of newer cellular and wireless technologies, there is a need to prevent devices operating in the various networks from interfering in those networks. At the same time, there is a need to enhance the ability of devices to effectively communicate in their respective networks.

BRIEF DESCRIPTION OF THE DRAWINGS

To further clarify at least some of the advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION

Figure 1:
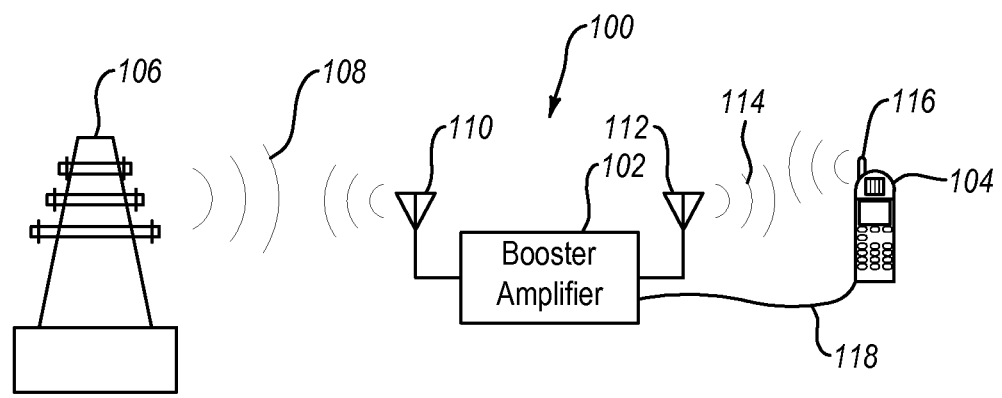
FIG. 1 illustrates an example of a booster amplifier operating in a communication system.

A properly functioning booster amplifier should be transparent to a wireless network such that base stations do not perceive any significant differences for either the case of a wireless device communicating by itself within the wireless network, or the wireless device communicating within the wireless network through the booster amplifier. Additionally, it may be desirable for emissions from the booster amplifier to be within limits acceptable to wireless networks, even without a wireless device communicating through the booster amplifier.

Embodiments of the invention may be discussed with reference to a wireless device operating in a wireless network. Example wireless devices may include cell phones, personal digital assistants, smart phones, laptop computers, tablet computers, modems, or other network enabled devices. One of skill in the art can appreciate that embodiments of the invention can be applied to other wireless networks including those operating on various frequencies throughout the electromagnetic spectrum. Wireless networks may include cellular networks as well as other wireless networks. References to cellular networks and cellular systems are also applicable more generally to wireless networks and wireless systems.

A base station may be any suitable location where the wireless network antenna and communications equipment is placed. A wireless network typically has many base stations in operation. A base station typically includes a transmitter/receiver, antenna tower, transmission radios and radio controllers for maintaining communications with wireless devices such as a cell phone or other wireless devices within a given range. Similarly, "a base station" may refer to one or more base stations. A wireless device may also be representative of other devices that may communicate through the booster amplifier. Embodiments of the booster amplifier discussed herein, for example, may amplify signals transmitter and/or received by one or more wireless devices in communication with one or more base stations.

In the present disclosure, the term "reverse link" refers to the transmission path of a signal being transmitted from a wireless device to a base station. In some embodiments, the reverse link may also be referred to herein as an uplink. The term "forward link" refers to the transmission path of a signal being transmitted from the base station to a wireless device. In some embodiments, the forward link may also be referred to herein as a downlink. The phrases "reverse link signal," "forward link signal," "uplink signal" and "downlink signal" are not limited to any particular type of data that may be transmitted between a wireless device and a base station, but instead are simply used to specify the direction in which a signal is being transmitted.

Some embodiments relate to amplifiers, including booster amplifiers, that enhance the ability of a wireless device such as a cellular telephone (or other device configured to communicate over a wireless network) to communicate in a wireless network. Embodiments extend to an amplifier that adjusts the gain, dynamically in some embodiments, that is applied to a wireless signal within the wireless network. Embodiments further relate to systems and methods for managing at least one of base station overload, noise floor protection, and self-oscillation as they relate to amplifiers such as booster amplifiers.

Some embodiments of a booster amplifier variably adjusts its gain as needed. The ability to variably and/or automatically adjust the gain applied to a wireless signal can prevent the booster amplifier from generating emissions that may interfere with the operation of a wireless network within which the booster amplifier is operating, with other wireless networks, or with the operation of the booster amplifier itself. Too much gain, for example, can cause the booster amplifier to oscillate, which may result in interference to the wireless network and may adversely impact users of the wireless network. Also, too much gain may unnecessarily increases the amount of residual noise at the base stations. Too little gain may interfere with the ability of the wireless device to communicate in the wireless network. As previously stated, embodiments of the invention protect against at least one of power overload oscillation, and/or excessive noise floor increase.

Some embodiments consider parameters that may have an impact on the operation of the booster amplifier when setting the booster amplifier's gain. The booster amplifier includes circuitry, modules and/or components (e.g., hardware, software, firmware, etc.) that determine an optimum gain under various circumstances based on these parameters. The booster amplifier can be configured to determine an optimum gain by mitigating the effect of specific issues individually and/or multiple issues at the same time. The booster amplifier can determine an optimum gain to mitigate each of the issues that have been considered by the booster amplifier. In one example, the booster amplifier generates potential gains for each issue. These potential gains can then be harmonized to generate a final gain that may be optimum in light of all the issues that are being mitigated.

Embodiments of the booster amplifier can be integrated with a wireless device or connect with the wireless device either wirelessly or wired. The booster amplifier acts as an intermediary between a base station and the wireless device. Signals generated by the wireless device are amplified and retransmitted by the booster amplifier. The booster amplifier also receives signals from the base station and transmits the amplified signals to the wireless device after applying a gain to the received signals. In some examples, the gain may reduce the strength of the signal.

In some embodiments, the booster amplifier receives a first wireless signal from a base station via a first antenna and a second wireless signal from a wireless device via a second antenna. A control circuit analyzes the inputs and/or outputs of the booster amplifier and adjusts a gain (or an amplification factor) in a manner that accounts for the parameters sensed using various inputs to the amplifier.

The adjusted gain is applied to the first and/or second wireless signals, and the resulting wireless signals are retransmitted via the first and second antennas to the base station and the wireless device, respectively. In some embodiments, the gain applied to the wireless signals in one direction (e.g., from the base station to the wireless device) may be different from the gain applied to the wireless signals in the other direction (e.g., from the wireless device to the base station).

FIG. 1 shows an example communications system 100. The communications system 100 may be a cellular telephone wireless network or other wireless network. In this example, a booster amplifier 102 configured to amplify signals transmitted between a base station 106 and a device 104. The device 104 may be any type of wireless device. In a typical system, the booster amplifier 102 is located in close proximity to the device 104 in comparison to the distance between the booster amplifier 102 and the base station 106. The base station 106 transmits a signal 108 into the surrounding air, which is attenuated for various reasons known to one of skill in the art as it travels outward from the base station 106. An antenna 110 receives the signal 108 and converts the radiated signal into a conducted electrical signal.

The booster amplifier 102 amplifies the electrical signal and communicates the amplified signal to the device 104. In one example, the booster amplifier 102 may retransmit the electrical signal from a second antenna 112 as an amplified RF signal 114 to the device 104. The amplified signal 114 is received by an antenna 116 of device 104, which processes the signal and ultimately communicates the appropriate content to a user of device 104.

As previously indicated, the booster amplifier 102 may be an integral part of, or separate from, the device 104. The booster amplifier 102 may also be implemented in a cradle configured to hold the device 104. For example, the cradle may be mounted on a dash of a car and the device 104 may be placed in the cradle. The communication between the cradle, which may include the booster amplifier 102, may be wired and/or wireless. In addition, signals to and from the device 104 may be communicated with the amplifier 102 using a wired cable 118 and/or the antenna 112. More generally, the booster amplifier 102 may be included in a different form. When the booster amplifier 102 is used, for example, in a building or other area, the form may be adapted or configured for placement or mounting as appropriate for the location.

Similarly, the device 104 may communicate content to the booster amplifier 102 by transmitting an RF signal from the antenna 116, which is ultimately received by the antenna 112. The booster amplifier 102 amplifies the received signal and retransmits the signal using the antenna 110. The transmitted signal is received by the base station 106, which may perform a number of operations on the signal, as determined by the wireless service provider.

During operation, the booster amplifier 102 can dynamically amplify signals transmitted to the base station 106 as well as signals received from the base station 106. The gain applied to the signals being amplified can be dynamically adjusted over time and in accordance with various factors. For example, the gain may be set to account for or to mitigate potential issues that may arise in the wireless environment. The booster amplifier 102 may be configured to prevent the amplifier itself from interfering with the operation of the wireless system 100 or of the base station 106 or of other devices operating in the system 100 or with other wireless systems that may be in operation.

For example, embodiments of the invention consider parameters that may have an impact on the operation of the booster amplifier 102 when setting the booster amplifier's 102 gain. In particular, the operation of the booster amplifier 102 is monitored such that the booster amplifier 102 does not oscillate. If oscillation is detected in the booster amplifier 102, then the gain of the booster amplifier 102 is reduced or the booster amplifier 102 is turned off in order to eliminate the oscillation and reduce the adverse effects of the oscillation.

Because it may be possible to confuse oscillation with valid amplification, embodiments of the invention also distinguish between oscillation and valid amplification. By way of example only, a desirable signal may be present when the device 104 is used to communicate in the system 100 or transmit/receive signals (e.g., a cellular phone call, Internet access, etc., are examples of when a desirable signal is present). When the device 104 is idle or not being used, a desirable signal may not be present at the input to the booster amplifier 102. It may also be possible for oscillation to occur when amplifying a valid signal.

The booster amplifier 102 includes circuitry, modules and/or components (e.g., hardware, software, firmware, etc.) that determine an optimum gain or optimum configuration (including off) under various circumstances including oscillation. The booster amplifier 102 can be configured, for example, to reduce, change, or eliminate the gain applied by the booster amplifier 102 when oscillation is detected or when other issues are detected.

Figure 2:
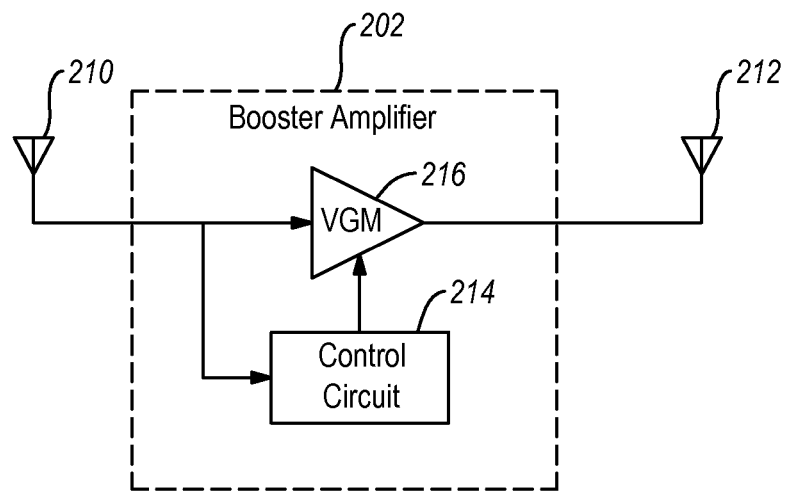
FIG. 2 illustrates a generalized booster amplifier with a control circuit that controls gain level.

FIG. 2 illustrates a generalized directional booster amplifier 202 (an example of the booster amplifier 102) configured for producing an optimal gain level. The booster amplifier 202 is unidirectional in this example in the sense that gain is only controlled in the reverse link direction or in the forward link direction. The booster amplifier 202 is connected to a first antenna 210, which is configured to receive a signal. The first antenna 210 converts the received signal into an electrical signal. The electrical signal is received by a variable gain module (VGM) 216, which applies an amplification factor to the electrical signal. In one embodiment, the electrical signal is communicated via a second antenna 212, which transmits the adjusted electrical signal as an RF signal, to be received by one or more wireless devices, which may include handsets.

The variable gain module 216 is controlled by a control circuit 214. The control circuit 214 receives the electrical signal from the first antenna 210, and based on, by way of example, the properties of the electrical signal and/or other parameters, determines an optimal amplification factor that should be applied to the electrical signal. The control circuit 214 provides a control signal to the variable gain module 216. The control signal instructs the variable gain module 216 as to the amplification factor that should be applied to the electrical signal.

Many factors or parameters may be accounted for when calculating the required amplification factor. Factors include, by way of example and not limitation, the level or strength of the electrical signal and whether there is any indication that the booster amplifier 202 is oscillating or overloading a wireless network in which the booster amplifier 202 is operating in any way or affecting other wireless networks.

The amplification factor, in one embodiment, can be a multiplier that is applied to the electrical signal. The amplification factor can result in either an amplified or attenuated output signal. In other words, where the absolute value of the amplification factor is less than one, the amplified adjusted signal will have lower amplitude than the original electrical signal. Conversely, when the absolute value of the amplification factor is greater than one, the amplified adjusted signal will have greater amplitude than the original electrical signal.

The control circuit 214 is an example of a processor that can be used for processing inputs. As described in more detail below, the control circuit 214 may also receive other inputs, which are examples of factors or parameters that are used when setting the gain to be applied to the electrical signal. The inputs can be derived from the input signal or received from other sources.

Figure 3:
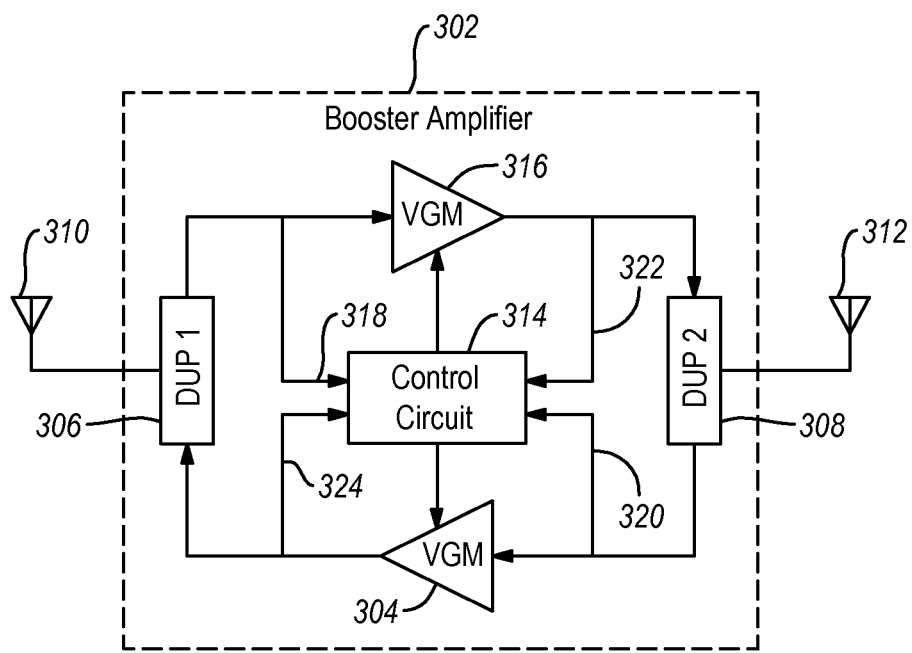
FIG. 3 illustrates an embodiment of a bi-directional booster amplifier configured to control the amplification of signals between at least two devices.

FIG. 3 illustrates one embodiment of a bi-directional booster amplifier 302 (an example of the booster amplifier 102) configured to control the amplification of wireless signals being transmitted between a base station and a device (or other wireless signals transmitted between two devices or apparatus). In the booster amplifier 302, a wireless signal is received from a base station at the antenna 310 and is passed to both a control circuit 314 and a variable gain module 316. Control circuit 314 controls the amplification factor of the variable gain module 316. The amplified signal may be connected to a second antenna 312, which transmits a wireless signal to a device.

Bi-directional booster amplifier 302 is also configured to receive signals from one or more devices (e.g., wireless devices), amplify those signals, and retransmit the amplified signals to a base station. A signal from a device may be received by antenna 312. The signal is routed to a second variable gain module 304, which applies an amplification factor to the signal. The amplification factor is determined and controlled by control circuitry 314.

In order to allow antennas 310 and 312 to simultaneously transmit and receive signals, duplexers (DUP) 306 and 308 are provided by way of example. A duplexer is defined as an automatic electrical routing device that permits simultaneous transmitting and receiving through a common point. More generally, a duplexer is a three-port device with one common port "A" and two independent ports "B" and "C." Ideally, signals are passed from A to B and from C to A, but not between B and C. For example, the duplexer 306 receives an RF signal from a base station and converts the signal into a first electrical signal, which is routed to the inputs of the variable gain device 316 and the control circuitry 314. The duplexer 306 may also receive a second electrical signal from the output of the variable gain module 304, and causes this signal to be transmitted as an RF signal via the antenna 310.

The control circuitry 314 may be configured to accomplish various objectives when determining the amplification factors to be applied to the variable gain modules 304 and 316. Exemplary objectives include, but are not limited to, i) setting the power level at which the signals are transmitted at a sufficient level to ensure that the signals reach a target destination; and ii) ensuring that the signals transmitted from the booster amplifier 302 are transmitted at a power level that substantially eliminates the interference that would otherwise be introduced into the surrounding wireless network.

First, the control circuitry 314 establishes the amplification factors of the variable gain modules 304 and 316 so that the resultant signals are transmitted with sufficient power to adequately reach a target destination, such as a device or a base station while not exceeding regulatory or other (e.g. industry) established power limitations. When the wireless signal received at the antenna 310 has undergone significant attenuation, e.g., when the target destination is located a long distance away from the booster amplifier 302, the amplification factor is increased. Conversely, when the wireless signal received at the antenna 310 is at a sufficiently high level, a lower amplification may be established for variable gain modules 316 and 304. Thus, the amplification factor or gain for various conditions can be determined by considering these parameters.

Second, the control circuitry 314 ensures that the signals transmitted from the booster amplifier 302 are transmitted at a power level that substantially reduces or eliminates the interference that would otherwise be introduced into the surrounding wireless network. Many wireless networks, such as CDMA systems, are configured such that the power level transmitted by each device in the network is determined by the base station. When communication between a device and a base station is initiated, a "handshake" occurs between the device and base station, and the base station instructs the device as to the power at which the device should transmit. If the base station determines that the signal from the device is too strong, it will instruct the device to reduce the power level of the transmitted signal. The CDMA system is designed so that all of the signals coming into the base station are of approximately the same power. If one signal arrives at the base station at a power level that is significantly higher than the others, it can potentially overpower the base station and cause interference with the other devices in communication with the base station.

Therefore, the control circuitry 314 may determine the maximum amplitude or power level that can be transmitted by antenna 310 to substantially eliminate interference. Interference is considered to be substantially eliminated, in one example, when signals are transmitted from the booster amplifier 302 without causing harmful effects to the surrounding wireless network. For example, interference is substantially eliminated when the signals are transmitted without overpowering the base station, or otherwise interfering with other devices within the wireless network in a way that degrades their performance. The control circuitry 314 may establish the amplification factors applied to variable gain modules to either attenuate or amplify the electrical signals in order to achieve this objective.

The determination of the amplification factor values may be dependent on whether the signals received from the base station via antenna 310 exceed a threshold (also referred to herein as a threshold level or threshold value). The threshold value may be a predetermined set value, or may be a variable that is not established until the control circuitry 314 makes a determination. For example, if after analyzing the strength of the signals received via antenna 310, the control circuitry 314 determines that the signal attenuation between the booster amplifier 302 and the target base station or device is substantial, the control circuitry 314 may establish higher threshold values than if the base station signal was less attenuated. The higher threshold values would allow a greater amplification factor to be applied to the signals so that the transmitted signals will reach their target destination. Because of the substantial distance over which the signals must traverse, the signals will arrive at the target destination (e.g., a base station) without exceeding an appropriate power level, and will therefore not overpower the base station or cause substantial interference with signals transmitted from other devices.

In the embodiment of FIG. 3, the amplification factors applied to the variable gain modules 316 and 304 may both be determined based on the attributes of the signal received from a base station via the antenna 310. The input signal from the base station is received by the control circuitry 314 from the antenna 310 at the connection 318, and radiated to a device via antenna 312. The control circuitry 314 can make a number of determinations based on the attributes of the base station signal. First, the control circuitry 314 can determine the amplitude level of the signal from the base station. Based on the amplitude level, the control circuitry 314 can determine an adequate amplification factor for the variable gain module 316 to enable communication of the received signal to a device. Second, the amplitude of the signal received from the base station is also an indicator of the amplitude required to successfully transmit a signal back to the base station via the antenna 310. For example, if the control circuitry 314 measures low amplitude of the first electrical signal, it is likely that the signal transmitted by the base station has been substantially attenuated between the base station and the booster amplifier 302. Therefore, it can determine the amplification factor required by the variable gain module 304 so that the second electrical signal originating from the device is retransmitted with sufficient power to reach the base station (within allowable regulatory and/or other established power limitations).

The control circuit 314 may also receive additional input. The control circuit may receive an input signal from the connections 320, 322, and 324 which correspond, respectively, to the input signal from the device (which may be received wirelessly), the output signal of the VGM 316, and the output signal of the VGM 304.

Figure 4:
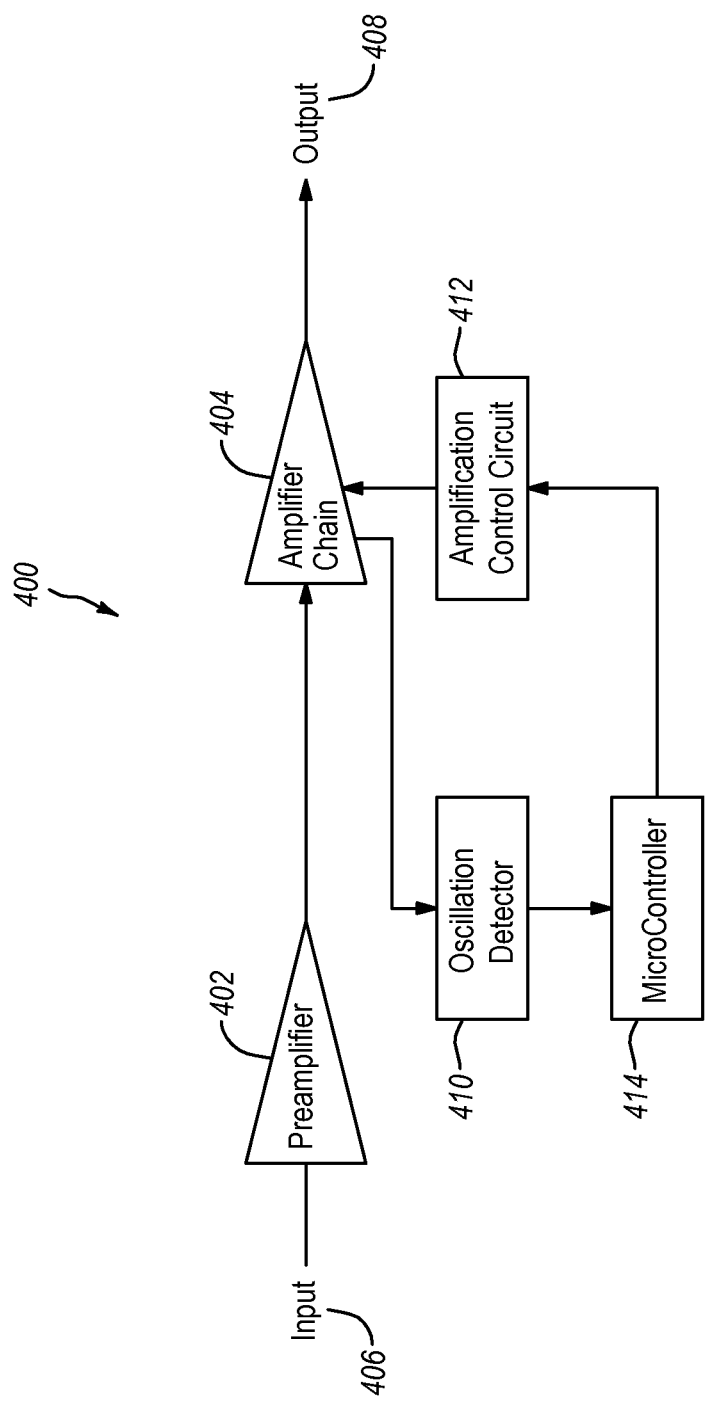
FIG. 4 illustrates another embodiment of a booster amplifier.

FIG. 4 generally illustrates another embodiment of a booster amplifier 400. FIG. 4 illustrates an example of the booster amplifier 400 in the context of detecting oscillation and is used to illustrate aspects of oscillation mitigation in the booster amplifier 400.

The booster amplifier 400 may include one or more stages (including a final power stage and one or more preceding stages) and may be configured to amplify signals transmitted to a base station as well as received from the base station. When embodiments of the invention operate in the reverse link path and the forward link path, the circuitry can be adapted to account for the signal path. For example, one amplifier (or chain of amplifiers) may amplify in the reverse link direction while another amplifier (or chain of amplifiers) may be used to amplify in the other direction. Some components can be shared, such as a microcontroller 414 (which is an example of the control circuit 314). The microcontroller 414 may have the ability to control amplification in either the reverse link or forward link direction. Suitable hardware may be provided in order to route these signals as necessary within the booster amplifier 400. Alternatively, the microcontroller is an example of control circuitry. The operations of the microcontroller 414 can be implemented in hardware and/or software.

In this example, an input 406 (e.g., a signal from a base station or from a wireless device) is provided to a preamplifier 402. An output of the preamplifier 402 usually contains amplified input signals (examples of desired signals) and amplified thermal noise such as amplified broadband thermal noise. By way of example only, in the 800 MHz Cellular band, the reverse link bandwidth could be from 824 to 849 MHz, and in the 1900 MHz PCS band, the reverse link bandwidth could be from 1850 to 1910 MHz.

The output of the preamplifier 402 is provided to the amplifier chain 404. The oscillation detector 410 is configured to detect or sample an output of the amplifier chain 404. Alternatively, the oscillation detector 410 can sample the signal at any point in the amplification chain 404 including before and/or after the signal is operated on by the amplifier chain 404. In this example, the oscillation detector 410 may sample the output of the amplifier chain 404, although the oscillation detector 410 may also sample the signals received and/or transmitted by the amplifier 400 at other locations or at other times as previously stated. In addition, the oscillation detector 410 may be configured to operate with specific frequencies (e.g., the cellular band). Further, the preamplifier 402 may include a filter that restricts or controls which frequencies or bands are passed.

During oscillation detection, the oscillation detector 410 may sample the output of the amplifier chain 404 a multitude of times over a predetermined time period. By way of example, the output may be sampled about 100 times over a short period of time such as 3 milliseconds. One of skill in the art, with the benefit of the present disclosure, can appreciate that the different numbers of samples can vary and can be taken over different periods. For example, approximately 100 samples can be taken over 5 milliseconds. The number of samples and the time over which the samples are taken can vary. In addition, the samples can be taken continuously or at predetermined intervals. In one embodiment, samples are taken continuously and a time window can be applied to the samples for evaluating the samples. A 3 millisecond window, by way of example, can be applied to the samples taken by the oscillation detector 410. By continuously taking and evaluating samples, the status (e.g., oscillating or not oscillating) of the booster amplifier 400 can be repeatedly evaluated.

The samples taken by the oscillation detector 410 may be provided to the microcontroller 414. The microcontroller 414 can then evaluate the samples to determine the status of the amplifier 400.

In many wireless networks (e.g., CDMA, GSM, LTE, WiMAX), there is a high peak to average power ratio (PAPR) (e.g., 5 to 10 dB in some examples). Oscillation, in contrast, in the booster amplifier 400 has a substantially lower peak to average power ratio value because oscillation saturates the amplifier and compresses the signal. In this case, the PAPR may be closer to 0 dB, which may indicate a carrier or oscillation.

Thus, the microcontroller 414 can determine the PAPR and determine whether the booster amplifier 400 may be oscillating using samples of the signal over a certain time period. In one example, if the PAPR exceeds a threshold level, then the microcontroller 414 determines that the booster amplifier 400 is not oscillating. If the PAPR is below the threshold value, then the booster amplifier 400 may be oscillating. In some examples, additional processes may be performed to verify the oscillation status before the gain is actually reduced or before the booster amplifier 400 is shut down. These processes may be performed in order to prevent any use of the device from being unnecessarily interrupted. In other words, the gain may be reduced first when a desirable signal is being amplified and oscillation is detected. In some embodiments, the threshold to which the PAPR is compared may be determined based on the characteristics of the wireless network in which the booster amplifier 400 operates. In particular, the threshold may be determined based on the PAPR for the wireless signals, e.g. the forward link and reverse link signals within the wireless network. For example, the booster amplifier 400 may operate in a wireless network that supports CDMA signaling. The CDMA signaling may have a PAPR of 5 or 10 dB. The threshold value may be selected to be below the CMDA signaling PAPR but high enough to determine oscillations. For example, the threshold may be selected as 1, 2, 2.5, or 3 dB.

When oscillation is detected, the gain of the booster amplifier 400 is reduced or the booster amplifier 400 is turned off using an amplification control circuit 412. The microcontroller 414 communicates with the amplification control circuit 412 to control the gain of the amplifier chain 404 and thus the booster amplifier 400 as necessary to eliminate the oscillation. The gain can be gradually reduced, reduced in steps, or the like. If oscillation is not present, normal operation may be resumed by the booster amplifier 400, which may include dynamically adjusting the gain of the booster amplifier 400. In one embodiment, the ability of the booster amplifier 400 to dynamically adjust the gain may be restricted or reduced when the output of the amplification control circuit 412 indicates that the booster amplifier 404 is off or has reduced gain. The amplification control circuit 412, in other words, may have control that supersedes other components of the booster amplifier 400. The ability to dynamically adjust the gain, along with other methods disclosed herein, may be implemented in hardware, software, firmware, or any combination thereof.

Embodiments of the invention can reduce the effect of oscillation. The booster amplifier 400 is controlled by determining whether oscillation is present. When the booster amplifier 400 is being used to amplify a desirable signal, the booster amplifier 400 is enabled to operate normally. If oscillation is detected even when amplifying a desirable signal, the gain may be reduced as discussed herein.

The proper gain of the booster amplifier 400 can be achieved gradually, for example when oscillation is detected, by a variable attenuator or by changing a bias voltage applied to an amplifier (e.g., to the amplifier chain 404) within the booster amplifier 400.

Figure 5A:
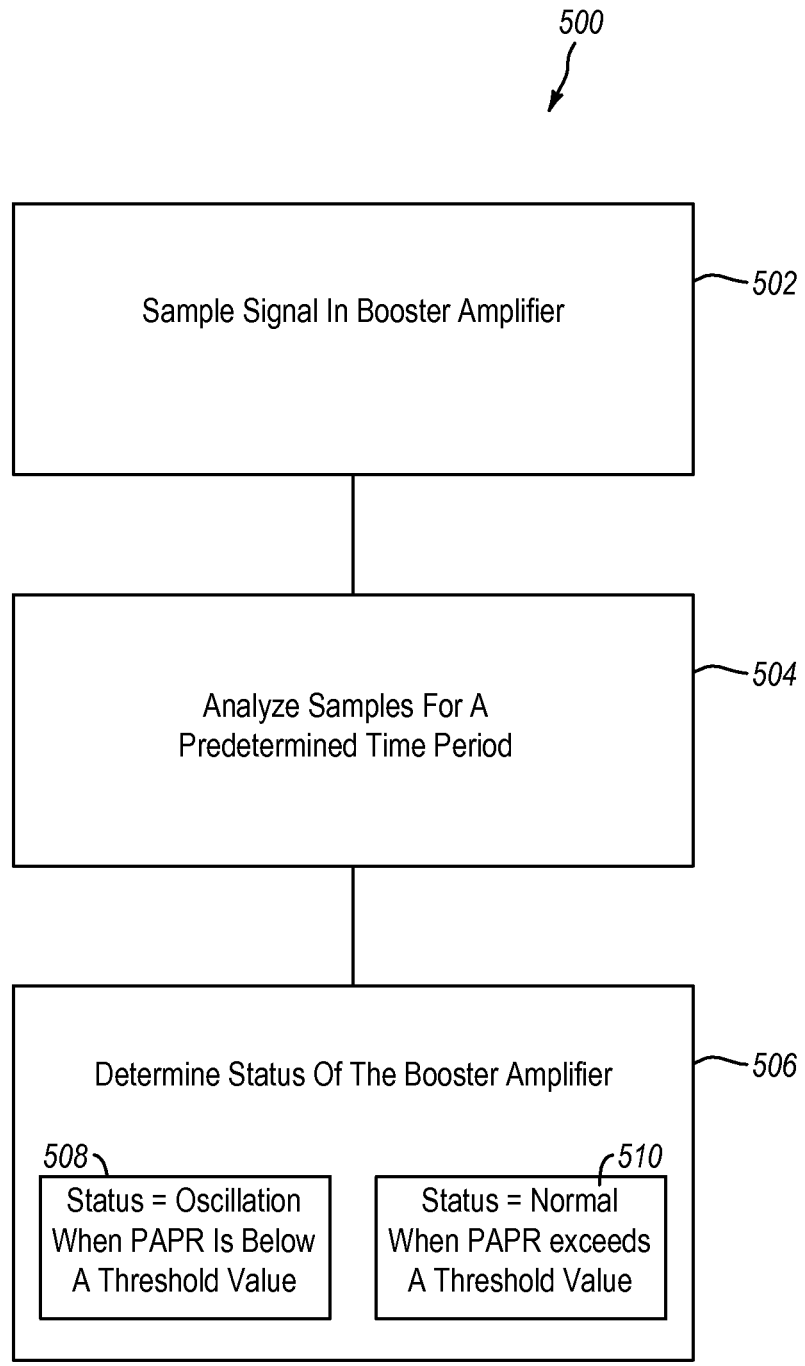
FIG. 5A-5E illustrate examples of methods for handling oscillation in a booster amplifier or for reducing oscillation in a booster amplifier.

FIG. 5A illustrates an exemplary method for handling or detecting oscillation in a booster amplifier. The method 500 may also be used as a precursor to identify a potential oscillation that is then verified in another manner. This can eliminate false positives that may occur when the status of the booster amplifier is either based on signal samples taken over a short time frame, or based upon a signal with a low PAPR. The methods of FIG. 5A (as well as the methods of FIGS. 5B-5E) may be performed by detection unit or controllers in a booster amplifier, such as the oscillation detector 410 and/or the microcontroller 414 of FIG. 4.

A method 500 for reducing booster amplifier noise may begin by sampling 502 a signal being amplified in the booster amplifier. The sampling may be continuous in one example or may occur periodically. The samples can be taken at any point in the booster amplifier, such as in an amplifier chain in the booster amplifier.

The method 500 then analyzes 504 the samples over a predetermined time period. Analyzing the samples can be done by applying a time window to the samples. In some embodiments, the time window may be stored in memory. The samples can be stored, for example, in a rotating buffer. The samples may be analyzed to determine at least a PAPR.

The method 500 then determines 506 a status of the booster amplifier. If the PAPR is below a threshold, it may be determined 508 that oscillation may be occurring in the booster amplifier and the booster amplifier's gain may be adjusted accordingly. For example, the gain may be reduced in stages, an amplifier or amplifier chain within the booster amplifier may be turned off, or the like. If PAPR exceeds a threshold, it may be determined 510 that oscillation is not occurring. In these and other embodiments, the booster amplifier may be allowed to operate normally. Often, when oscillation is determined to be occurring, the gain of the booster amplifier is reduced until the effects of oscillation are removed at which point the booster amplifier may be allowed to resume normal operation at reduced gain or normal gains.

In some embodiments, when determining 506 the status of the booster amplifier, a certain number of samples within a predetermined amount of time are averaged. The peak value of the samples can be identified from the samples and the average of all the samples is then determined. The resulting PAPR is then compared to a threshold value to determine the status of the booster amplifier. The status of the booster amplifier may be oscillation when the PAPR is less than the threshold value and the status is normal when the PAPR exceeds the threshold value.

The samples in a given window or predetermined amount of time may be used to determine one or more signal ratios or power ratios including, by way of example only, a PAPR, a peak to peak power ratio, or a change in sample power levels.

More generally and by way of example and not limitation, examples of signal or power ratios include peak to average power ratio, a change in sample power levels for a signal, a peak to minimum power ratio, peak to average power ratio, among others. One or more of these power ratios can be used to determine the status of the amplifier. For example, each ratio can be compared to a threshold or predetermined value (this may be a different predetermined value for different power ratios). The result of the comparison can indicate whether the status of the amplifier is oscillation or normal. In one example, the status may be verified by another procedure.

In determining the peak to peak power ratio, the ratio may be determined from samples that may include adjacent peaks, multiple pairs of adjacent peaks, an average determined from multiple pairs of adjacent peaks, non-adjacent peaks, or the like or any combination thereof. A change in sample power levels may be determined from the samples. A peak to minimum power ratio can be determined from samples that include various combinations of peaks and minimum values. The signal ratio in this example may include an analysis of multiple pairs of adjacent samples and the change in power levels from the multiple pairs of samples can be averaged.

The status, determined at 506, may be determined using one or more of the signal ratios. Of course, the status can be determined using only one of the signal ratios and there is no requirement that more than one signal ratio be used to determine the status of the amplifier.

The relationship between the signal ratio and a threshold or a predetermined value can be used by the controller to determine whether oscillation is occurring in the booster amplifier. One of skill in the art can appreciate that the predetermined value can be selected such that oscillation can be determined with the signal ratio is less than, greater than, equal to or greater than, equal to or less than, or the like, than the predetermined value.

For example, if the controller determines that oscillation is occurring (the status is oscillation) when the signal ratio is below a predetermined value or threshold, then the controller may reduce the gain, turn off amplifiers within the booster amplifier (or any one of the stages of amplifiers), or the like. Often, the gain is controlled until the effects of oscillation are removed at which point the booster amplifier may be allowed to resume normal operation. In this context, the signal ratio is continually reevaluated in order to determine when the oscillation has been eliminated or controlled. Monitoring the signal ratio (or the signal ratios) provides an effective means to determine when the booster amplifier is allowed to resume normal operation.

When determining the status of the booster amplifier, a certain number of samples within a predetermined amount of time may be averaged. The peak value of the samples can be identified and the average of all the samples can also be determined when the signal ratio is the PAPR. The resulting PAPR is then compared to a threshold or predetermined value to determine the status of the booster amplifier. The status is oscillation when the PAPR is less than the threshold value and normal when the PAPR is equal to or exceeds the threshold value. Alternatively, an average PAPR that is obtained by averaging the PAPRs associated with multiple windows may also be used in determining the status of the booster amplifier.

Similarly, other signal ratios can be used to determine the status of the booster amplifier. The peak to peak power ratio for samples in at least one window or the change in sample power levels in at least one window are also signal ratios that can be used to determine the status of the booster amplifier as illustrated in FIG. 5.

During operation (or at another time such as evaluation or testing), the gain of the booster amplifier may be increased to a level above the current operating gain where such an increased level is where oscillation begins. This enables a margin between the operating gain and the oscillation point to be determined. In addition, this may be useful during operation of the device since the booster amplifier may be able to estimate how much gain can be increased before oscillation occurs in the booster amplifier. If the margin varies in operation due to actual operating conditions, embodiments of the invention may determine the status of the booster amplifier independently of using the margin.

When it is determined that the amplifier is oscillating or that the status is oscillation at 508, some embodiments may perform further routines to confirm that the booster amplifier is oscillating. For example, a short time window of samples may indicate that the booster amplifier is oscillating when in fact, the booster amplifier is not oscillating. In other words, the booster amplifier may or may not be treated as oscillatory when the status is determined at 508 when the PAPR is less than the threshold value.

FIGS. 5B-5E illustrate further examples of methods for reducing oscillation in a booster amplifier. The methods illustrated in FIGS. 5B-5E, or portions thereof, can also be combined with the method of FIG. 5A to determine if a booster amplifier is oscillating, to prevent oscillation in the booster amplifier. Some of the elements illustrated in FIGS. 5B-5E may occur prior to, during, and/or after the elements illustrated in FIG. 5A. For example, receiving a downlink signal, receiving an uplink signal, and measuring aspects of these signals (e.g., input power) may be performed continuously or repeatedly by the amplifier. These values or measurements may be used in determining the status of the amplifier.

Figure 5B:
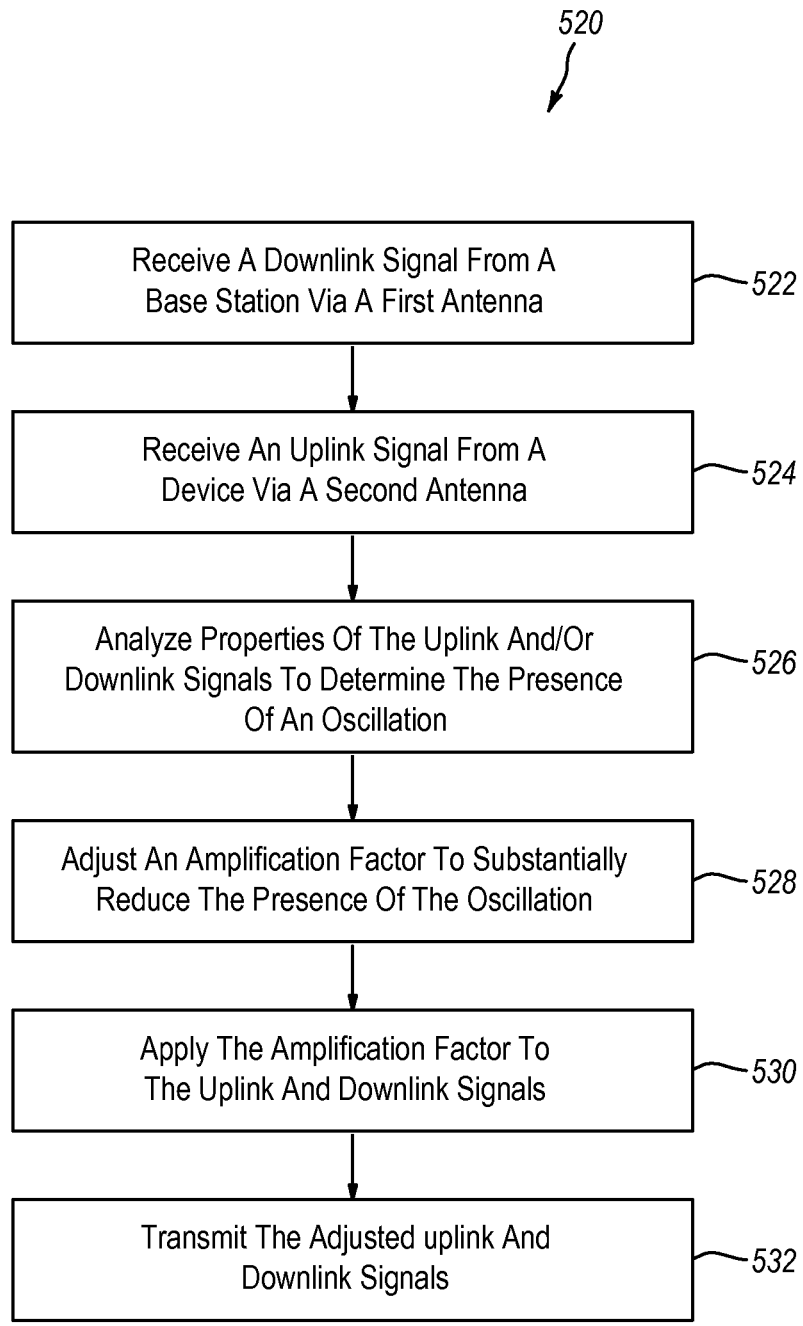

FIG. 5B illustrates a flow diagram for a method 520 of reducing oscillation in a booster amplifier. A booster amplifier may include one or more antennas. A first antenna may be configured to communicate with a device and a second antenna is configured for communication with a base station.

Method 520 includes receiving 522 a downlink signal at the booster amplifier from a base station via a first antenna, and receiving 524 an uplink signal from a device via a second antenna. The downlink and/or uplink signals are analyzed 526 to determine the presence of or confirm an oscillation created by the booster amplifier. As previously stated, this determination may be confirmed after the status of oscillation is determined based on the PAPR.

If an oscillation is detected, the amplification factor may be adjusted 528 in a manner that substantially reduces the presence of the oscillation. In some embodiments, control circuitry (such as control circuit 314) may perform the analysis of the downlink and/or uplink signals and the adjustment of the amplification factor. In one embodiment, oscillation is considered to be substantially reduced when the presence of oscillation is reduced to a level that does not introduce interference into the surrounding wireless network.

In one embodiment, analyzing at 526 the downlink and/or uplink signals includes measuring a signal level (e.g., input power) of the downlink and/or uplink signals. The measured signal levels may be compared to predetermined values. The predetermined values may be selected based on values that, if exceeded by the downlink and/or uplink signals, is likely to be indicative of an oscillating condition within the amplifier.

In one embodiment, where the predetermined value is exceeded, the amplification factor is reduced by an amount necessary to substantially reduce the oscillation. For example, the amplification factor may be incrementally reduced until the downlink and/or uplink signals fall below the predetermined value. The downlink and uplink signals may be associated with different predetermined values.

Alternatively, the amplification factor may be automatically reduced to a zero value in the event that the signal level of the downlink and/or uplink signals exceeds the predetermined value. On the other hand, if the predetermined value is not exceeded, the amplification factor may be established so as to produce first and second amplified wireless signals that are strong enough to be successfully transmitted to the device and the base station, without increasing noise at either the base station or the device beyond a tolerable limit. In other words, the amplification factor may be increased to a value that allows signals to be transmitted between the device and the base station without poor reception or dropped calls.

Method 520 further includes applying 530 the adjusted amplification factor to the uplink and downlink signals. The adjusted amplification factor may be applied to the signals using variable gain modules. As described above, the amplification factor may actually include a first and second amplification factor, where the first amplification factor is applied to the downlink signal, and the second amplification factor is applied to the uplink signal.

Method 520 also includes transmitting 532 the amplified uplink signal to the base station via the first antenna, and the amplified downlink signal to the device via the second antenna.

Figure 5C:
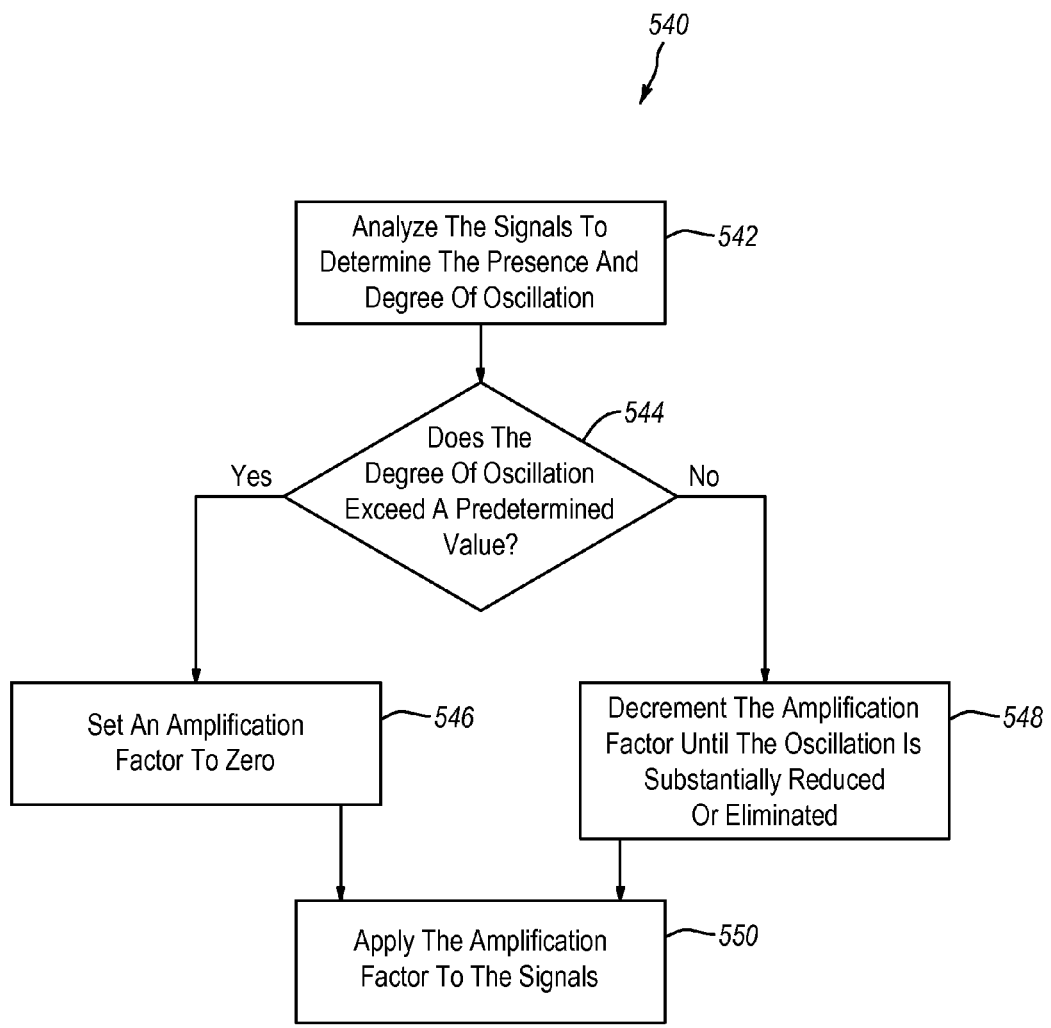

FIG. 5C illustrates a flow diagram for a method 540 performed by a control circuit for use in a booster amplifier. The booster amplifier includes first and second antennas and at least one variable gain module. As described herein, the booster amplifier is configured for the amplification and transmission of cellular or other wireless signals between a device and a base station. The method 540 includes analyzing 542 the wireless signals to determine the presence and/or degree of oscillation within the booster amplifier. Based on this analysis, the control circuit makes the determination 544 of whether an oscillation is detected at a degree that exceeds a predetermined value.

The predetermined value may be selected to represent a degree of oscillation that if exceeded, produces a level of interference into a surrounding cellular or wireless network. If it is determined that the degree of oscillation exceeds the predetermined value (i.e., the degree of oscillation is likely to generate sufficiently adverse interference), the amplification factor may immediately be set 546 to a zero value. If, on the other hand, it is determined that the degree of oscillation is detected at a degree that does not exceed the predetermined value (i.e., the degree of oscillation is either negligible or relatively minor, thus causing no interference or relatively mild interference), the amplification factor may be repeatedly decremented 548 until the oscillation is substantially reduced.

Finally the control circuit instructs 550 at least one variable gain module to apply the resultant amplification factor to the wireless signals. In some embodiments, a control circuit may instruct variable gain modules as to what amplification factor to apply to the wireless signals.

In one embodiment, if it is determined that the booster amplifier does not have any significant degree of oscillation, method 540 may further include establishing the amplification factor so that the retransmitted wireless signals have sufficient power to be transmitted to the base station and/or device.

Figure 5D:
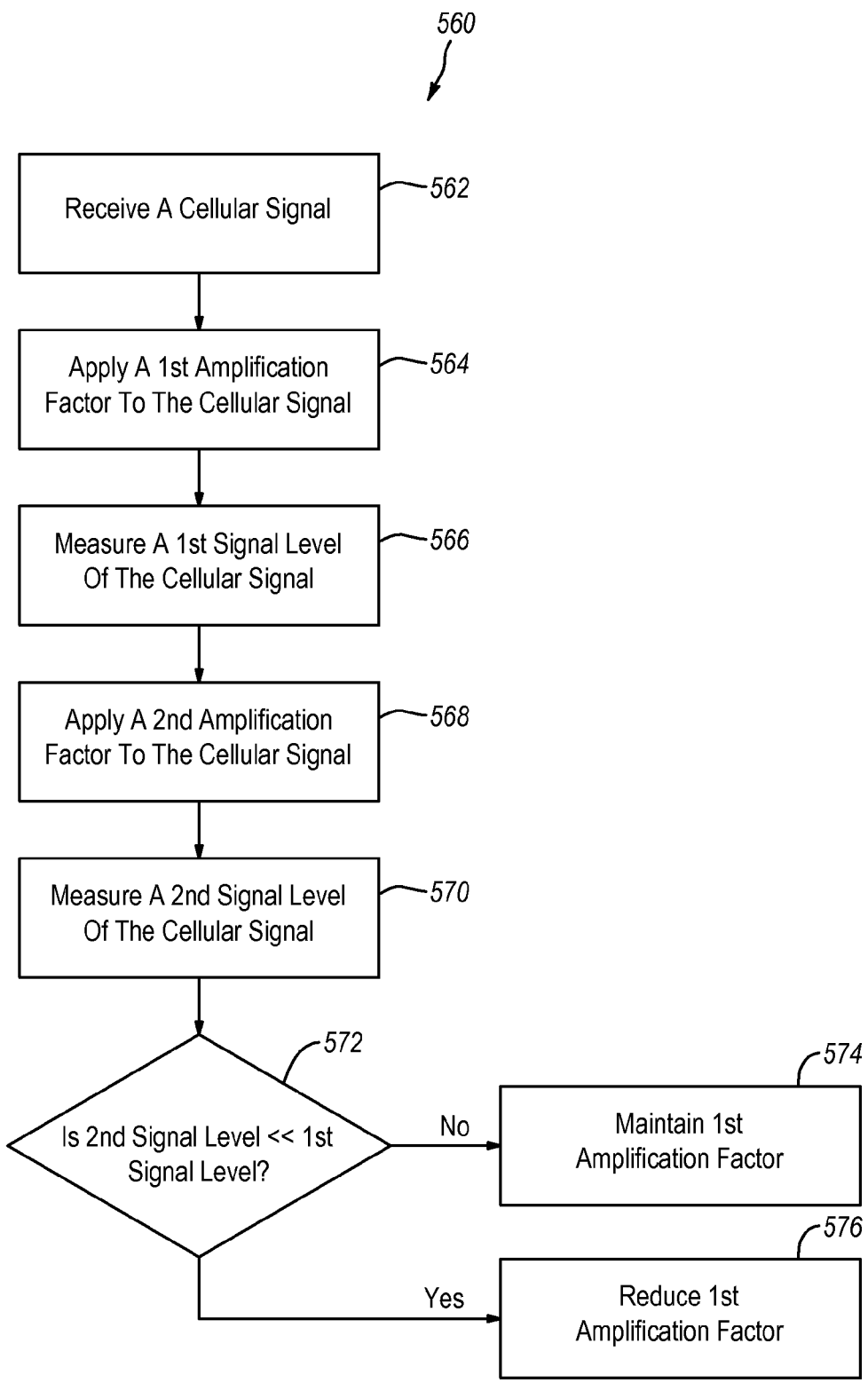

FIG. 5D illustrates one embodiment of a method 560 for detecting and substantially reducing oscillation in a booster amplifier. A cellular (or wireless) signal is received 562 by a first antenna. The wireless signal is amplified 564 by an amount determined by a first amplification factor. The resultant amplified wireless signal is transmitted via a second antenna to a target destination, such as a device or base station.

After the wireless signal is received 562 by the first antenna and while the first amplification factor is being applied to the wireless signal, the level of the wireless signal is measured 566, thereby acquiring a first signal level. The first signal level is recorded, and then a second amplification factor, which is less than the first amplification factor, is applied 568 to the wireless signal. In one embodiment, the second amplification factor is approximately a zero value (e.g., the power amplifier within the booster amplifier amplifying the wireless signal may be turned off or disabled). In some embodiments, the second amplification factor is approximately one or greater than one so that the wireless signal passes through the booster amplifier with little or no amplification.

While the second amplification factor is being applied to the wireless signal, the level of the wireless signal is measured again 570, thereby acquiring a second signal level. The second signal level is compared 572 to the first signal level. If the second signal level is significantly less than the first signal level, then it is determined that the use of the first amplification factor is likely causing an oscillating condition to occur. Therefore, the first amplification factor is reduced 576 by a predetermined amount, and the process may be repeated until the first amplification factor is reduced by a sufficient amount to eliminate the oscillating condition. However, if the second signal level is not significantly less than the first signal level, it is likely that an oscillating condition does not exist while first amplification factor is applied to the wireless signal. Therefore, the first amplification factor remains unchanged 574, and the process may be repeated.

Figure 5E:
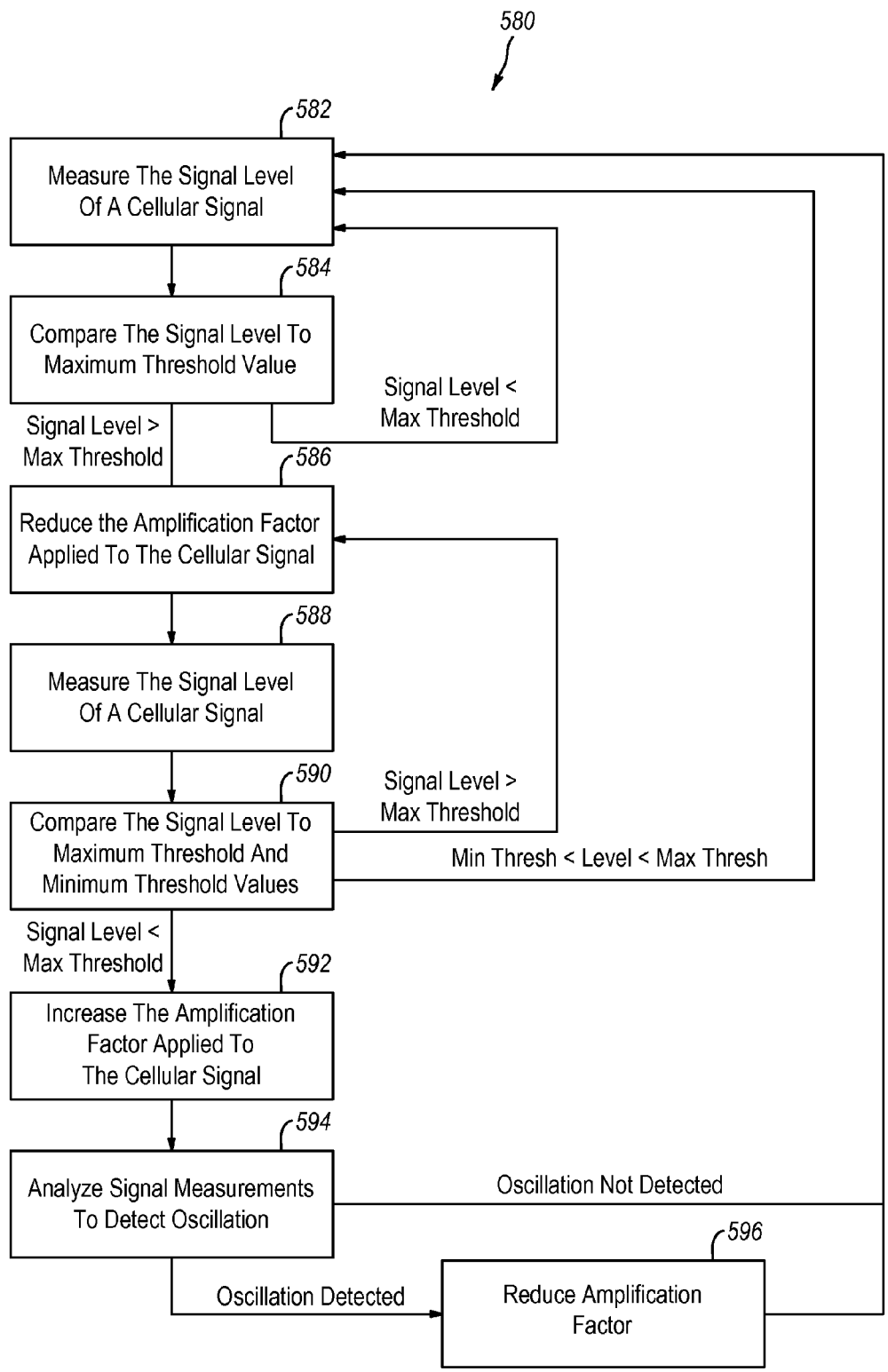

FIG. 5E illustrates another method 580 for detecting and substantially reducing an oscillating condition within a booster amplifier. In general, the method 580 includes the process of measuring 582 and 588 a wireless signal level and comparing 584 and 590 the wireless signal level to one or more threshold values. The amplification factor applied to the wireless signal is adjusted 586 and 592 based on the results of the comparisons. The results of multiple comparisons are analyzed 594 in order to detect a pattern that indicates that the presence of an oscillation is likely, and the amplification factor applied to the wireless signal is adjusted 596 in order to eliminate the oscillating condition.

In particular, and in one exemplary embodiment, after a wireless signal is received via an antenna and an amplification factor is applied to the wireless signal, the level of the wireless signal is measured 582 in order to determine 584 whether the wireless signal exceeds a predefined maximum threshold value. If the signal level of the wireless signal does not exceed the maximum threshold value, the method 580 continues measuring 582 the wireless signal and comparing 584 the signal to the maximum threshold value.

In the event that the signal level of the wireless signal exceeds the maximum threshold value, the method 580 reduces 586 the amplification factor applied to the wireless signal. Following the reduction of the amplification factor, the method 580 again measures 588 the signal level of the wireless signal. The method 580 then compares 590 the new signal level to the maximum threshold value and to a predetermined minimum threshold value. If the signal level still exceeds the maximum threshold value, the method 580 will continue to reduce 586 amplification factor applied to the wireless signal until the signal level no longer exceeds the maximum threshold value. If the signal level measured at 588 falls between the maximum threshold value and the minimum threshold value, the method repeats itself, starting with the measurement at 582. However, if the signal level measured at 588 falls below the minimum threshold value, the amplification factor applied to the wireless signal is increased by a predetermined amount.

Finally, the results of the comparisons and/or the adjustments made to the amplification factor are analyzed 594 in order to determine if an oscillating condition likely exists. In one embodiment, the measured signal levels are analyzed in order to detect a pattern that may indicate the presence of an oscillation.

For example, in one exemplary embodiment, the measured signal levels are analyzed in order to detect an alternating pattern, where the measurements of the signal levels alternate between exceeding the maximum threshold level and falling below the minimum threshold level. Therefore, an oscillation is identified if the signal level recorded during a first measurement exceeds the maximum threshold level, the signal level recorded during a second measurement falls below the minimum threshold level, and the signal level recorded during a third measurement exceeds the maximum threshold level. Likewise, an oscillation is also identified if the signal level recorded during a first measurement falls below the minimum threshold level, the signal level recorded during a second measurement exceeds the maximum threshold level, and the signal level recorded during a third measurement falls below the minimum threshold level.

Figure 6:
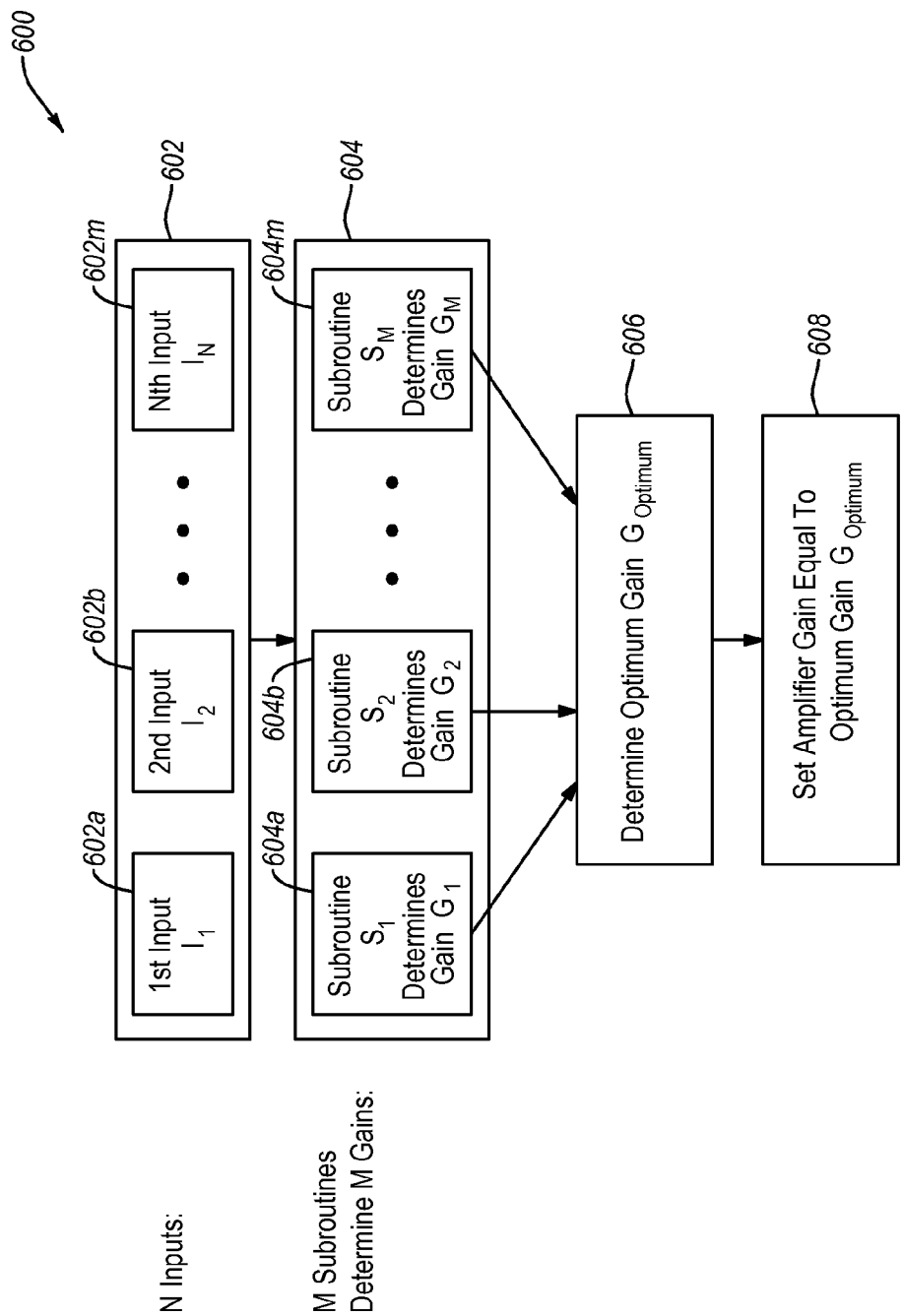
FIG. 6 illustrates an example of a method for determining an optimum gain for a booster amplifier.

FIG. 6 illustrates an example of a method 600 for determining an optimal gain for a booster amplifier. The method 600, or a portion thereof, can also be combined with the methods of FIG. 5A-5E to prevent or stop a booster amplifier from oscillating, among other things.

The inputs 602 can be received by a control circuit, such as the control circuit 314 of FIG. 3. At least some of the inputs 602 can be measured by the control circuit, stored in memory and accessed when needed, updated regularly by the booster amplifier, and the like.

The inputs 602 correspond to possible external parameters that may relate to issues that should be mitigated when setting the gain of the booster amplifier. Embodiments of the invention may only use some of the inputs and can be configured to accept additional inputs. Examples of the parameters that serve as the inputs 602 include, by way of example only:

Input to the booster amplifier received from a cell phone (or cell phones) or other device(s);
Output from the booster amplifier to a cell phone (or cell phones) or other device(s);
Input to the booster amplifier received from a base station (or base stations) and/or other wireless networks;
Output from the booster amplifier to a base station (or base stations) and/or other wireless network components;
Power/Current supplied to the booster amplifier from the power source (e.g. battery, power supply, etc.); and/or
Indication of a distance between cell phone(s) or other device(s) and the booster amplifier or its accessories (e.g. cradle for holding a cell phone, antennas, etc.).

As a result of any of the above inputs 602, and/or in consideration of relevant technical requirements, the method determines the control of the booster amplifier's circuitry such that optimum gain is obtained in both directions of amplification, i.e. from the base station(s) to the cell phone(s) or other device(s), and from the cell phone(s) or other device(s) to the base station(s).

FIG. 6 illustrates, in this example, a plurality of subroutines 604 that can be performed, for instance, by the control circuit 314 of FIG. 3 or other processor or controller. The subroutines 604 determine potential gains based on the corresponding input(s). More specifically, the subroutines 604a, 604b, . . . 604m determine optimum gains for the respective inputs 602a, 602b, . . . 602m or a combination of one or more of the inputs 602a, 602b, . . . 602m. The subroutines 604 may include subroutines that accept one or more of the inputs 602. As a result, the number of inputs is not necessarily the same as the number of the subroutines 604. In some examples, a particular subroutine may receive multiple inputs and be able to identify gains for multiple combinations of the inputs.

For example, the subroutine 604a may determine potential gain based upon the input 602a. Each of the subroutines 604 may be configured to mitigate a particular issue (e.g., power level, oscillation, distance from base station, distance from cell phone, power/current from power source, etc.). When determining a potential gain to mitigate an issue, each subroutine may use more than one of the inputs 602.

In the context of detecting oscillation, one of the inputs may be the status determined from comparing the PAPR to a threshold. The status (e.g., normal or oscillation), may be used by the subroutines in either confirming oscillation and/or mitigating the detected oscillation of the amplifier.

The subroutines 604 are not limited to a particular input. For example, the optimum gain to mitigate the distance between the booster amplifier and the base station may use the power/current drawn by the booster amplifier as well as the input from the base station.

In another example, the subroutines 604 can determine a potential gain according to the power level of the signals received from the base station. When setting the gain in consideration of this issue, the booster amplifier may i) consider setting the power level at which the signals are transmitted at a sufficient level to ensure that the signals reach a target destination; and ii) ensure that the signals transmitted from the booster amplifier are transmitted at a power level that substantially eliminates interference.

After the subroutines 604 have identified potential gains to mitigate for various issues, the control circuit determines 606 the optimum gain GOptimum based on the potential gains (G1-*m*) produced by the subroutines 604. The control circuit may then set 608 the booster amplifier gain equal to the optimum gain GOptimum. The booster amplifier gain may be different for reverse link signals than for forward link signals.

The performance of the booster amplifier is thus compatible with the cellular system and other wireless networks and provides maximum gain/performance to a device of a subscriber using the booster amplifier. This is done, in one embodiment, by implementing two or more subroutines. Each subroutine establishes the optimum gain allowable in consideration of the issues that the subroutines mitigate. In some instances, the subroutines can mitigate different issues using the same input(s). Embodiments generate an optimum or a preferred gain by encompassing several (two or more) subroutines each of which ameliorates a specific problem. The booster amplifier determines the optimum gain allowable for the booster amplifier in consideration of the potential gains generated by at least some of the subroutines. The booster amplifier is configured with structure and architecture that is amenable to adding additional subroutines for which the need becomes apparent. As additional problems are identified, additional subroutines can be included and used in determining the optimal gain for the booster amplifier.

Figure 7:
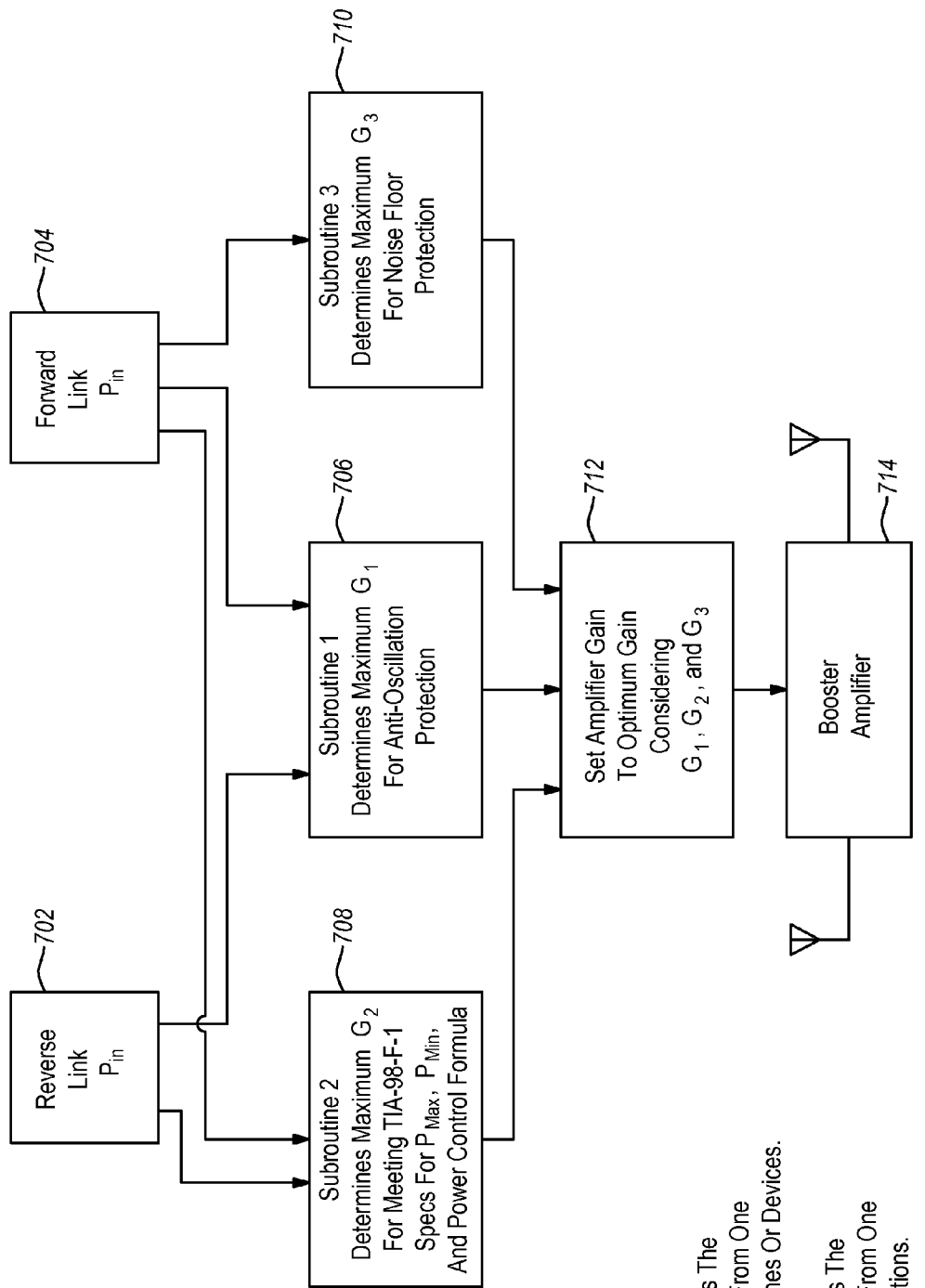
FIG. 7 illustrates an embodiment of a system and method for setting an optimum gain in a booster amplifier.

FIG. 7 illustrates an embodiment of a system and method for setting an optimum gain. Inputs 702 and 704 can be sensors/detectors that develop electrical output signals that are a function of Forward Link and Reverse Link power inputs to a booster amplifier 714, configured analogous to the booster amplifiers discussed herein. The Forward Link power input 704 is the power that is received from the base station and the Reverse Link power input 702 is the power received from the cell phone(s) and or other device(s). The booster amplifier 714 may use a single input 702 for all cell phones or multiple inputs 702. These electrical signals generated by the inputs 702 and 704 are processed by a processor, such as the control circuit 314 of FIG. 3 or other micro-processor/controller, using three unique subroutines in this example.

The first subroutine 706 determines the optimum Gain G1 in consideration of self-oscillation. The first subroutine 706 may be combined with the method in FIG. 5 to more definitively determine that the amplifier is oscillating before determining the optimum Gain G1. The second subroutine 708 determines the optimum Gain G2 considering the requirements of an industry standard, (e.g., TIA-98-F-1 and/or other standards). The third subroutine 710 determines the optimum Gain G3 in consideration of the maximum allowable noise increase in a base station's receiver or in the base station. Such noise can potentially interfere with the proper performance of base stations, and can be reduced to an acceptable level by controlling the gain of the booster amplifier 714.

The first subroutine 706 can determine a maximum gain G1 to account for oscillation in the booster amplifier 714 or for oscillation protection. For example, the first subroutine 706 analyzes the inputs (e.g., the cellular signals) in one example to detect the presence of an oscillation in the booster amplifier 714. This subroutine may be preceded, as previously stated, by the method of FIG. 5 that determines a status of the booster amplifier 714 based on the PAPR. Where an oscillation is detected or confirmed, the control circuit adjusts the gain G1 in a manner that stops the oscillating condition. The gain G1 can be determined by measuring the apparent signal level of the cellular signal received from the device and/or from the base station. If one or both of the signals exceed a predetermined signal value, an oscillatory condition likely exists, and the amplification factor of gain G1 is then reduced by a predefined amount.

In another embodiment, the booster amplifier 714 is simply shut off when an oscillation is detected. Alternatively, the value of the amplification factor may be incrementally reduced until the oscillation is eliminated. One embodiment of the invention combines both of the above aspects, and automatically shuts off the amplification when a severe oscillation is detected, but may alternatively incrementally reduce the amplification until a less severe oscillation is stopped.

In one example, a method for mitigating oscillation includes sampling a signal multiple times during a predetermined period. A peak to average power ratio is determined for the signals based on the samples. Then, a preliminary status of the booster amplifier 714 is determined. The booster amplifier 714 is determined to be oscillating when the PAPR is below a threshold and determined to be operating normally when the PAPR is above the threshold.

If the status is oscillation, then the method continues by measuring the apparent signal level of the cellular signal received from the device and/or from the base station. If one or both of these signals exceeds a predetermined signal value, an oscillatory condition likely exists and the gain G1 is set accordingly. In other words, the oscillation preliminarily detected by evaluating the PAPR is verified or confirmed by measuring the signal levels of the signals received from the device and/or the base station.

In one example when the status is oscillation, the gain is reduced immediately when oscillation is detected. The gain in either the reverse link and/or the forward link can be reduced or shut off. While reducing the gain or when shutting the booster amplifier 714 off, the reverse link power input from the device may still be sampled.

As previously described, embodiments of the booster amplifier 714 disclosed here can amplify both forward link and reverse link signals. The amplification factors applied to the forward link and/or reverse link signals can be adjusted when oscillation is detected. The second subroutine 708 determines a maximum gain G2. Wireless devices may have a built-in power control algorithm that adjusts their power output based upon the power that they receive from base stations. This built-in power control algorithm is in accordance with the requirements of relevant industry standards. For example, for CDMA phones, the standard is "Recommended Minimum Performance Standards for cdma2000® Spread Spectrum Mobile Stations—Addendum, TIA-98-F-1", published by the Telecommunications Industry Association. The initial power transmitted by the wireless device to a base station (i.e. before being in closed loop wherein the base station controls the wireless device's transmitted power) is a function of the power received from the base station. This wireless device reverse link (output) power should be maintained within close tolerances in order to preclude interfering with the base station and/or jeopardizing the communicability of the wireless device. With some exceptions that will be described, this is expressed, mathematically, by the above mentioned standard as:

$$P\text{out}=-P\text{in}-K$$

Where:
Pout is the (reverse link) output power of the wireless device in dBm;
Pin is the (forward link) power that the wireless device receives from a base station in dBm; and
K is a constant depending upon the frequency band and other factors and is most commonly equal to 73 dB for the 824-894 MHz band and 76 dB for the 1850-1910 MHz band.

Exceptions in one embodiment:
Maximum power may never exceed 30 dBm even when the formula implies a greater value;
Whenever the base station commands a wireless device to transmit Minimum Power, the wireless device's power must be −50 dBm or less; and
Whenever the base station commands a wireless device to transmit Maximum Power, the wireless device's power must be at least 23 dBm, but not more than 30 dBm.

There may be two inputs to subroutine 708. The first is indicative of the reverse link power input received by the booster amplifier 714 from a wireless device, and the second is indicative of the forward link power received by the booster amplifier 714 from a base station in one example. At any instant, knowing the reverse link power from the wireless device and the forward link power from the base station enables the subroutine to determine the gain of the booster amplifier 714 so that it is compliant with the above formula (e.g., Pout=−Pin−K) and exceptions identified above. The second subroutine 708 determines a maximum value for G2 that is the largest value possible in accordance with the above formula and special cases (exceptions).

The third subroutine 710 determines a gain for noise floor protection. In general, a booster amplifier transmits thermal noise that is inherently present at its input. The noise power output from any booster amplifier can be calculated using, by way of example and not limitation, the formula:

$N_{out} = FGkTB$, where $N_{out}$=noise power output in watts, F="noise factor" of the booster amplifier (this is a measure of the noise internally generated by the booster amplifier), G=gain of the booster amplifier, k=Boltzmann's constant (1.38e-23 watts/Hz-K), T=temperature (degrees Kelvin), and B=bandwidth (Hz).

By knowing the Forward Link power received from the base station, and additional factors which will be described, the third subroutine is able to establish a maximum value for gain G3 for the third subroutine 710.

The additional factors may include:

The equivalent radiated power of the base stations transmitter (i.e. transmitter power output increased by transmitting antenna gain and less losses such as those from cables, connectors, etc.);

The maximum allowable increase in noise that is permitted in the base station receiver, which is more commonly referred to as "allowable noise floor increase";

The gain of the base station's receiving antenna;

The gain of the booster amplifier's antenna;

The booster amplifier's gain; and

The booster amplifier's noise figure.

The parameters of the base station (e.g. equivalent radiated power, permitted increase in noise, gain of receiving antenna) may be set to be typical values that are generally known, or they may be set to be specifically required values when necessary, or some may be typical values and others can be set to specifically required values.

At any instant, based upon the received Forward Link power, the third subroutine 710 takes into account at least some of the above mentioned additional factors and determines the maximum gain G3 such that the noise power transmitted by the booster amplifier 714 will not cause the noise floor in the base station's receiver to increase by more than the allowable amount.

The gains G1, G2, and G3 of the subroutines 706, 708, and 710, respectively, are resolved to determine the optimal gain 712 by considering all of the gains generated by the subroutines 706, 708, and 710 for the booster amplifier 714. The optimal gain can be resolved, for example, by averaging, by weighted averaging, and the like. The optimal gain may be set to one of the potential gains generated by the subroutines. Alternatively, the optimal gain may be set to lowest potential gain (lowest value of G1, G2, G3). In some instances, the gain from one subroutine may be given preference or may act as a limit to the optimal gain.

For example, if the subroutine 706 determines a gain that is associated with oscillation, the potential gain determined by the first subroutine 706 may limit the optimal gain. In addition, the optimal gain can be updated repeatedly or continually. As the inputs to the subroutines change, the optimal gain is likely to change as well. Thus, embodiments of the invention can dynamically adapt to changes in the inputs that may impact the optimal gain of the booster amplifier 714 in either the reverse link and/or forward link direction.

In some embodiments, a microprocessor or control circuitry, with suitable interface circuitry, may send an electrical signal to a gain control (e.g., a variable attenuator or other VGM) of the booster amplifier 714 that sets the booster amplifier's 714 gain to be the optimal value that was determined as described herein.

Before an actual ("closed loop") connection is made between a base station and a wireless device (e.g., a cell phone), the wireless device is unconnected ("open loop") and attempts to make a connection by setting its initial output power based upon the received power from the base station that it intends to connect with. After making the connection with a base station, the base station controls the power transmitted by the wireless device, thereafter making continuous corrections to the wireless device's power output as may be necessary. However, if the unconnected ("open loop") transmitted power from a wireless device is not within established tolerances, it may not be possible for the wireless device to connect with the base station. Wireless devices have a built-in power control algorithm that adjusts their initial output power according to the power that they receive from base stations. The wireless device's built-in power control algorithm is in accordance with the requirements of relevant industry standards. Embodiments of the booster amplifier 714 disclosed herein ensure that the booster amplifier 714 does not interfere with either the closed loop and/or open loop algorithms.

Embodiments of the invention help to reduce the occurrences of the booster amplifier 714 increasing the Noise Floor of nearby off-channel Base Stations beyond an acceptable amount.

The power transmitted by the booster amplifier 714 thus is configured to better meet the requirements of a wireless system, as defined herein or as defined by the wireless system operator, industry standards, or government regulations. The embodiments described herein help reduce base station overloading by an excessively strong signal and help increase the ability of the booster amplifier 714 to generate an optimum gain of the base station's forward link signal (received by the cell phone) thereby giving maximum benefit to subscribers while reducing a likelihood of harm to a wireless system.

Figure 8:
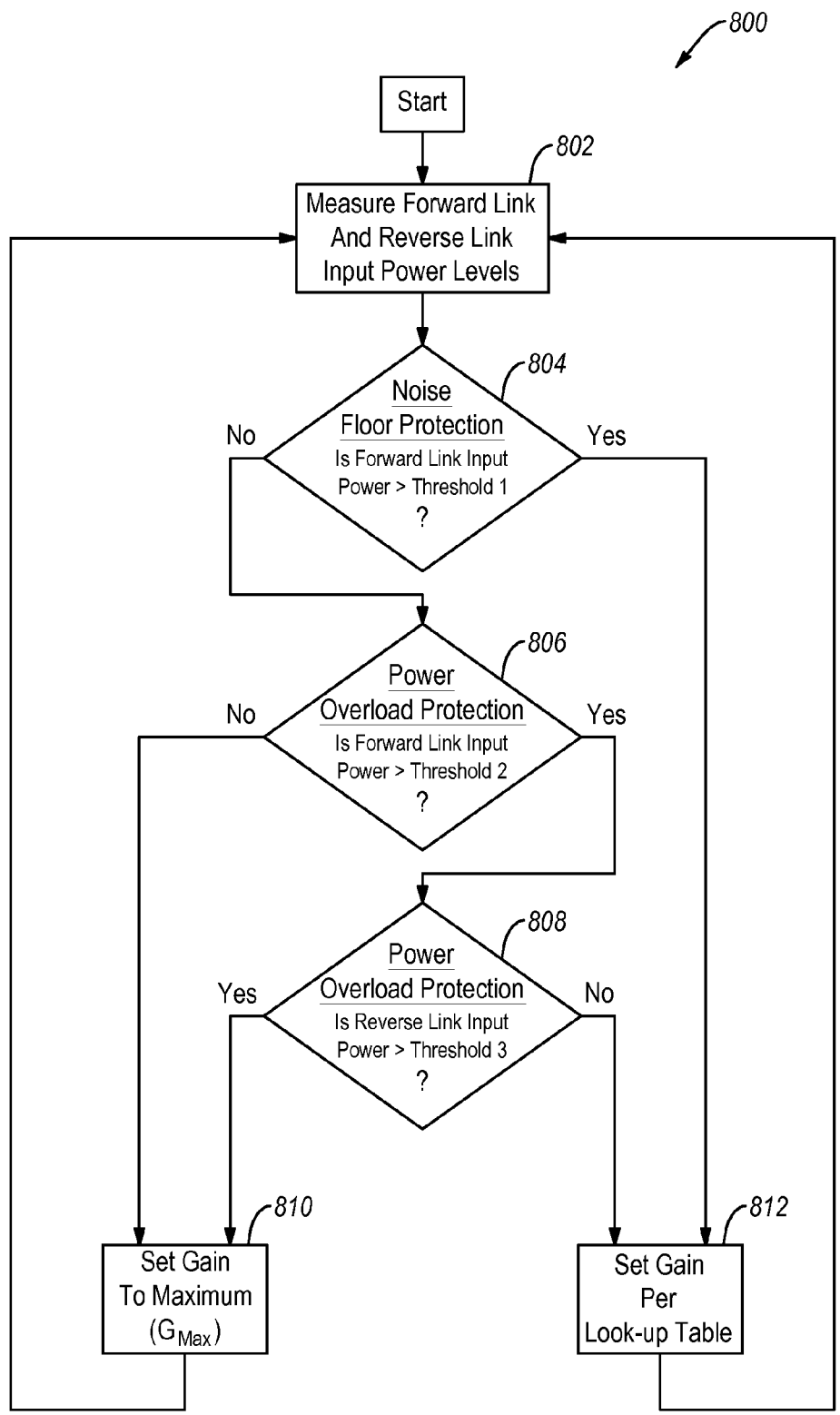
FIG. 8 illustrates an example of a flow diagram for setting the gain of a booster amplifier operating in a network environment.
Figure 9:
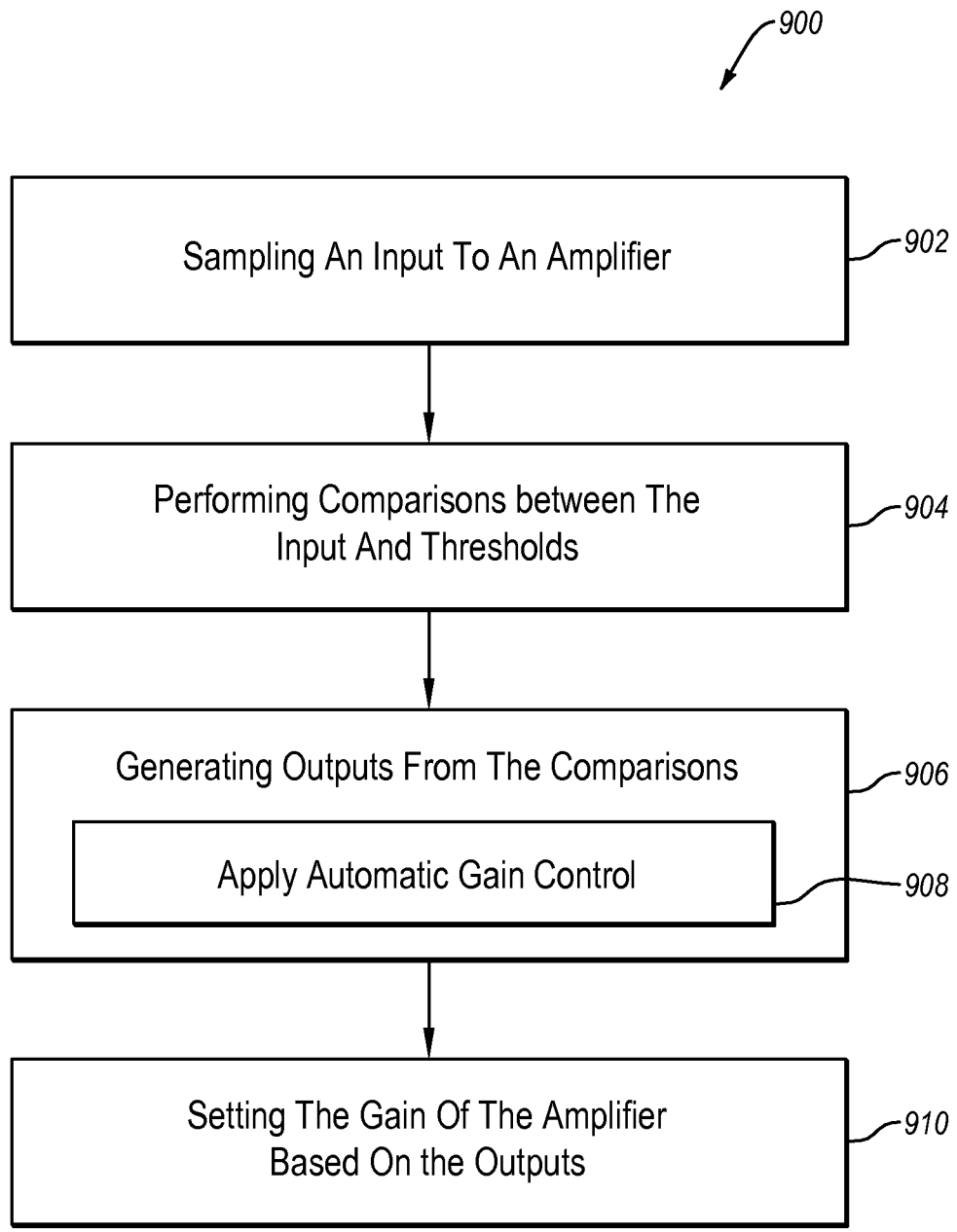
FIG. 9 illustrates another example of a flow diagram for setting the gain of a booster amplifier.
Figure 10:
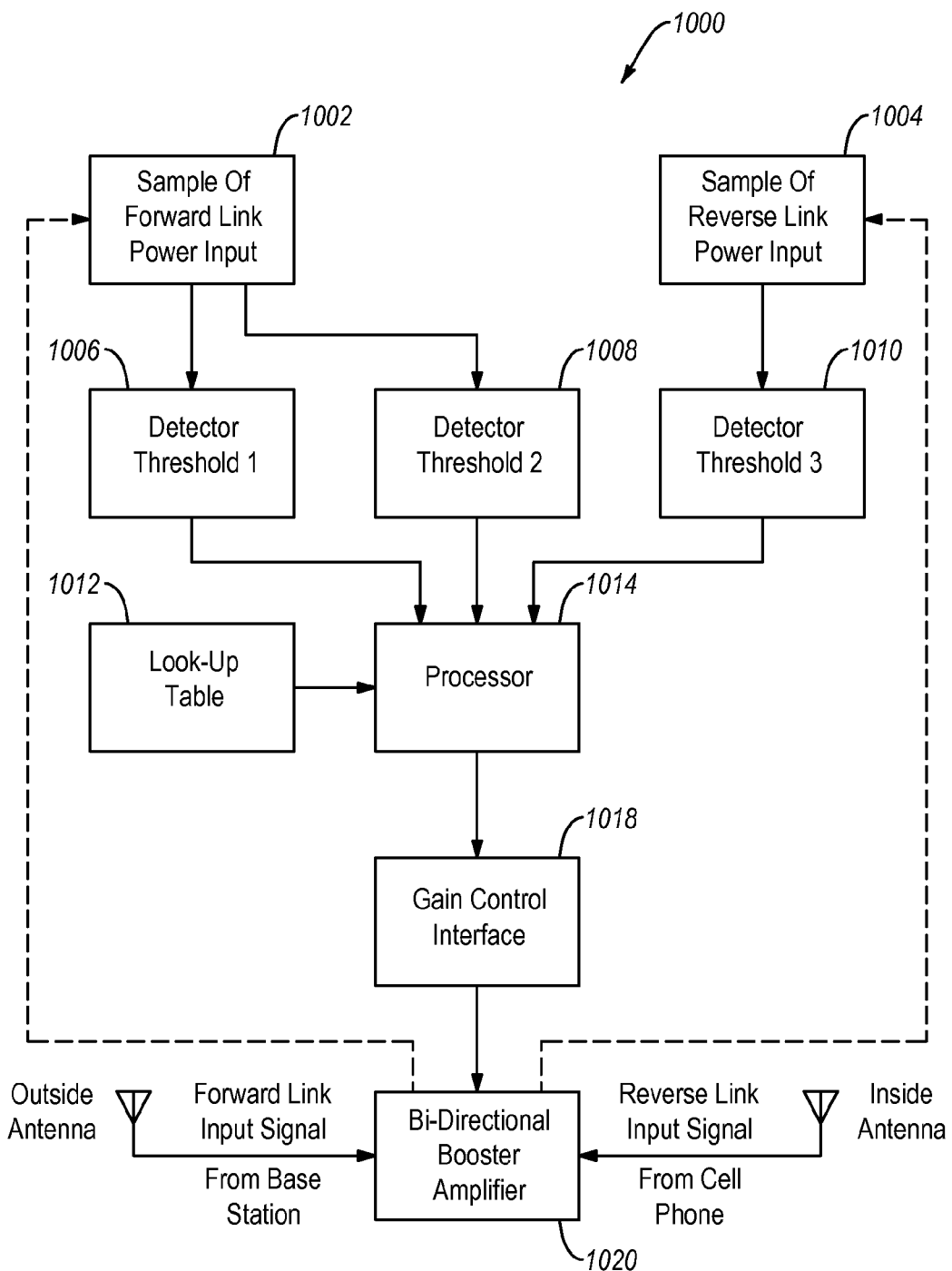
FIG. 10 illustrates an embodiment of a system and method for implementing the flow diagrams illustrated in FIGS. 8 and/or 9.

FIG. 8 illustrates a flow diagram for setting the gain of a booster amplifier or other device operating in a network environment. FIG. 9 illustrates another example of a flow diagram for setting the gain of a booster amplifier or other device. FIG. 10 shows an illustrative embodiment of a booster amplifier that implements the logic shown in FIGS. 8 and 9. In addition, FIGS. 8, 9 and 10 illustrate an example of the subroutines (e.g., the subroutines 706, 708, and/or 710) illustrated in FIG. 7.

The method 800 often begins by sensing 802 inputs. The inputs include, by way of example and not limitation: (i) power input to the booster received from a cell phone (or cell phones) or other device(s) (those knowledgeable in the art commonly refer to this as "reverse link" input) and (ii) power input to the booster received from a base station (or base stations) (those knowledgeable in the art commonly refer to this as "forward link" input).

Knowing the reverse link power from a device and the forward link power from base stations enables determination of the gain of the booster amplifier that gives maximum benefit to the subscriber while maintaining compliance with the requirements of wireless systems as explained herein.

Embodiments also substantially mitigate interference to nearby base stations, which are not in communications with the device. This is often referred to in the technical literature as the "Near/Far" problem. It occurs when a device is communicating with a distant ("far") base station while, at the same time, the device is physically located very close to a "near" base station that the device is not communicating with. As a result, the power output of the device) will be maximum in order to enable communicating with the far base station. But, such maximum power will be excessive to the near base station thereby causing interference, which could be extremely harmful to the near base station's operation.

Thus, the method 800 often begins by measuring or determining 802 the forward link and reverse link power levels. At block 804, the forward link input power is compared to a noise floor threshold level (threshold 1). The threshold level is the input that corresponds to a distance where noise floor interference is possible. If the forward link input power exceeds the noise floor threshold level, then the gain of the amplifier is set 812 to be the gain in a lookup table stored in the booster amplifier. When the input power does not exceed the noise floor threshold level, the forward link input power is compared 806 to a power overload threshold level to determine if there is a potential problem of power overload to nearby base stations. At block 806, a measurement is made that determines whether or not the forward link input power is greater than the power overload threshold level (threshold 2). When the forward link input power is less than the power overload threshold level, the gain of the booster amplifier may be set in box 810 to be the Maximum Gain (Gmax). When the forward link input power is greater than the power overload threshold level, then the reverse link input power is examined and compared in box 808 to a second power overload threshold level (threshold 3). If the second power overload threshold level is exceeded, then the booster amplifier's gain is set in box 810 to be the Maximum Gain (Gmax). If, however, the second power overload threshold level is not exceeded, then the booster amplifier's gain is set in box 812 to a value determined by the lookup table. After setting the gain of the booster amplifier to be either Gmax or to a value from the Lookup Table, the method returns to the initial measurement in block 802, and thereafter proceeds as previously described. This repetitive process continues as long as the booster amplifier is turned on.

In this way, the booster amplifier can dynamically determine the maximum gain for noise floor protection and/or for power overload protection.

One of skill in the art can appreciate that FIG. 8 illustrates examples and comparisons, which are performed in blocks 804, 806, and 808, to set the gain of the booster amplifier. The tests or comparisons in blocks 804, 806, and 808, however can be performed in a different order and/or with different dependencies. These tests or comparisons can also be performed independently. The gain of the booster amplifier can be set on the basis of a single comparison or on the basis of multiple comparisons. In addition, the comparisons used to set a particular gain can vary over time.

For example, the gain of the booster amplifier could be set based on a single comparison, any pair of comparisons, or any group of comparisons. In another example, the result of the comparison performed in block 806 may be used to trigger the comparison in block 804 and/or block 808.

FIG. 9 illustrates another example of a method 900 for setting the gain of a booster amplifier or other device. In one example, the method 900 (similar to other apparatus and methods disclosed herein) may operate to address problems such as booster amplifier oscillation, overload issues, and noise floor problems. Often, the gain set or determined in the method 900 (and other methods disclosed herein) is a maximum gain in the sense that it should not be exceeded based on current conditions. As discussed herein, this gain may be reduced or altered based on other conditions such as maintaining the linearity of the booster amplifier.

The method 900 begins in box 902 by sampling an input to a booster amplifier such as the booster amplifier 302 of FIG. 3. The input may include the forward link input power, the reverse link input power, or other inputs or signals as discussed herein.

In box 904, comparisons are performed between the input and thresholds. For example, the forward link input power may be compared to one or more threshold values or levels. Similarly, the reverse link input power may be compared to one or more threshold values or levels.

The thresholds may include thresholds that are related to various issues that the booster amplifier may encounter. One of the thresholds may relate to a noise floor. Another threshold may relate to power overload protection. In some instances, the threshold for noise floor or power overload protection may be different for different inputs. As described herein, the comparisons can be performed in any order.

In box 906, outputs are generated from the comparisons performed in box 904 (examples of the comparisons are discussed herein and shown by way of example only in FIG. 8). The gain of the booster amplifier is set based on the outputs in box 910. When setting the gain, by way of example, the booster amplifier may use one or more of the outputs. The outputs can be selectively evaluated such that the gain to which the booster amplifier is set may be based on any combination of the outputs. Each of the various outputs, for example, may be ranked or prioritized in some examples. The rank or prioritization of the outputs may change, however, based on conditions experienced by the device, booster amplifier, base station, or the like. In addition, the gain can be dynamically adjusted over time as the outputs of the comparisons change.

In addition, the booster amplifier may also apply automatic gain control in box 908. Automatic gain control may be applied to the booster amplifier, for example, to maintain linearity of the booster amplifier. As a result, the gain determined by the outputs of the comparisons may be further altered by applying automatic gain control. For example, if the outputs of the comparisons suggest that the booster amplifier should be set at maximum gain, automatic gain control may reduce the gain, for example, to maintain linearity. Automatic gain control can be applied in both the forward link and reverse link directions and the gain may be different in the forward link and the reverse link directions.

In one example, a lookup table, such as illustrated in FIG. 10, may be used when setting the gain or when setting the amplification factors. When the lookup table is used to set the gain, the lookup table may be accessed, by way of example only, based on whether the various input signal levels are greater than or less than the various thresholds, based on one or more of the inputs to the booster amplifier, based on what type of issues is being mitigated, or the like or any combination thereof. For example, when the lookup table is used to set the gain, the lookup table may be accessed according to the forward link input power, the reverse link input power, or the like.

In another example, multiple lookup tables may be present. In this case, the lookup tables may be accessed based on one or more of the inputs (e.g., the forward or reverse link input power) and the type of issue being mitigated. As a result, the gain of the booster amplifier can be optimized using the lookup tables. FIG. 10 illustrates an example of a bi-directional booster amplifier 1020. In FIG. 10, a sample relative to the power level of the forward link signal from the Base Station is detected to determine whether the signal is above or below either Threshold 1 or Threshold 2. The sample 1002 is provided to a detector 1006 and a detector 1008. The detector 1006 can determine whether the sample 1002 exceeds the threshold 1 and the detector 1008 can determine whether the sample 1002 exceeds the threshold 2. Similarly, a sample 1004 relative to the power level of the reverse link signal from a subscriber's device (e.g., cell phone, PDA, etc.) is detected to determine whether the signal is above or below Threshold 3 using a detector 1010. The samples may be provided as a voltage and the comparisons of the samples 1002 and 1004 to the relevant thresholds can be achieved using a voltage comparison circuit (which may be included in the processor 1014). The samples can be converted to digital values before comparison to the relevant threshold values.

The outputs from the three threshold detectors 1006, 1008, and 1010 are provided to the processor 1014. The processor 1014 may be a microprocessor, or a simple transistor or other logic circuit. The processor 1014 is also connected to a lookup table 1012 that could be an integral part of the processor 1014 or may be located in memory that is external to the processor 1014. The processor 1014 examines the outputs of the detectors 1006, 1008, and 1010 and also examines the Lookup Table 1012 (as needed) in order to determine the required gain of the bi-directional booster amplifier 1020 as described with reference to FIGS. 8 and 9. After the required or optimal gain is determined, the processor 1014 originates a signal that feeds the gain control interface 1018. The gain control interface 1018 gives the correct drive (or signal) to the device(s) that actually adjust(s) the gain of the bi-directional booster amplifier 1020. As previously stated, the gain control interface 1018 may also apply automatic gain control to the bi-directional booster amplifier 1020, which may change or reduce the optimal gain, for various reasons, such as to maintain linearity of the bi-directional booster amplifier 1020.

There are several types of devices that could enable adjustable gain. Some examples are: pin-diode attenuators and active gain devices whose gain depends upon a DC control voltage, etc. The gain of the bi-directional booster amplifier 1020 may or may not be equal in forward link and reverse link directions depending upon the characteristics of the signals being amplified by the bi-directional booster amplifier 1020. The threshold detectors 1006, 1008, and 1010, the processor 1014, lookup table 1012, and gain control interface 1018 could be included in one hardware device (e.g. a PIC).

The lookup table(s) may include values that are determined according to characteristics of the bi-directional booster amplifier 1020, base stations, and device(s). For instance, the maximum gain of the bi-directional booster amplifier 1020 and the noise figure of the bi-directional booster amplifier 1020 may influence the values in the lookup table. The allowable increase in the base station noise floor, and equivalent isotropic radiated power of the base station, the forward link power received at the antenna input of the bi-directional booster amplifier 1020, the maximum cell phone radiated power, the gain of the base station receive antenna, the path loss between the bi-directional booster amplifier 1020 and the base station, and the path loss between the bi-directional booster amplifier 1020 and device(s), are additional examples of values that may influence the parameters set in the lookup table.

The following paragraphs assume the following values:
Maximum Gain of bi-directional booster amplifier 1020=38 dB;
Noise figure of bi-directional booster amplifier 1020=6 dB;
Allowable increase in base station noise floor=0.06 dB;
Base Station Output Power=30 dBm;
Forward Link Power received at bi-directional booster amplifier 1020
outside antenna input=−28.9 dBm;
Maximum Cell Phone Radiated Power=23 dBm;
Path Loss between bi-directional booster amplifier 1020 and base station=77.6 dB; and
Path Loss between bi-directional booster amplifier 1020 and cell phone=17 dB In this example, the above parameter values may be for the bi-directional booster amplifier 1020 and typical base station characteristics. One of skill in the art can appreciate the determination of other values based on another booster amplifier and/or base station characteristics and/or path losses. In addition, changes to these values may require changing the lookup tables used to set the gain in the bi-directional booster amplifier 1020.

As previously stated, some of the values may be determined according to the characteristics of the bi-directional booster amplifier 1020. For example, to protect the base station noise floor when the forward link input power is equal to −27 dBm, the maximum allowable reverse link gain plus noise figure of the bi-directional booster amplifier 1020 is 38 dB. The bi-directional booster amplifier 1020 should lower its gain to this level even if this results in shutting the bi-directional booster amplifier 1020 off. This is an example of the gain of the bi-directional booster amplifier 1020 for the first threshold, for example, at 804 in FIG. 8.

For the second threshold and to protect against base station overload, for example at 806 in FIG. 8, when the forward link input power is −38 dBm the maximum allowable reverse link gain of the bi-directional booster amplifier 1020 is 21 dB.

For the third threshold and to protect from base station overload, for example at 808 in FIG. 8, when the reverse link input power is +8 dBm the maximum allowable reverse link gain of the bi-directional booster amplifier 1020 is 22 dB. The level of the reverse and forward link input powers allows the bi-directional booster amplifier 1020 to determine whether the device (e.g., cell phone) is communicating with a near or far base station in order to optimize gain.

In one example, a gain in a bi-directional booster amplifier 1020 is set by initially measuring a forward link input power and/or a reverse link input power. The forward link input power is compared to a noise floor threshold level. A gain of the bi-directional booster amplifier 1020 is set to a value in a lookup table when the forward link input power exceeds the noise floor threshold level.

If necessary, the forward link input power is compared to a first power overload protection threshold level when the forward link input power does not exceed the noise floor threshold level and the gain is set to a maximum gain when the forward link input power does not exceed the first power overload protection threshold level.

If necessary, the reverse link input power is compared to a second power overload protection threshold level when the forward link input power exceeds the first power overload protection threshold level. The gain is set to the maximum gain when the reverse link input power exceeds the second power overload protection threshold level. Alternatively, the gain is set according to a value in the lookup table when the reverse link input power does not exceed the second power overload protection threshold level.

As described previously, with respect to FIGS. 4 and 5A, a booster amplifier may be configured to detect oscillations based on a signal power ratio within the booster amplifier. As described, the booster amplifier may be configured to sample the power of a signal within the booster amplifier one or more times. The booster amplifier may be further configured to analyze the power samples to determine a power ratio of the signal within the booster amplifier. One such power ratio may be a PAPR ratio. Based on the comparison of the power ratio to a threshold value, which may be computed based on the characteristics of the wireless network in which the booster amplifier is operating, the booster amplifier may be able to determine if an oscillation is occurring. In some embodiments, a power ratio of a signal determined by the booster amplifier may be a difference between powers levels of the power samples. For example, the power ratio of a signal may be a difference between a power sample with a highest power and a power sample with a lowest power or an average power of the power samples.

As noted, however, in some circumstances, comparing a determined power ratio to a threshold value for determining oscillations (referred to hereafter as power-ratio oscillation detection) may provide false indications (also referred to as false positives) that the booster amplifier is oscillating. In particular, in networks where signaling schemes do not provide a comparatively large PAPR ratio, a booster amplifier may falsely detect an oscillation using the power-ratio oscillation detection method, described above. While power-ratio oscillation detection may result in false positives, power-ratio oscillation detection does not have the booster amplifier adjust an amplification factor applied to a signal in the booster amplifier. Not adjusting an amplification factor applied to a signal in the booster amplifier may reduce spurious noise and other unwanted effects that may result from adjusting an amplification factor applied to a signal.

In some embodiments, a booster amplifier may be configured to perform an additional oscillation detection method to verify that an oscillation is in fact occurring after power-ratio oscillation detection indicates that oscillation is occurring. In these and other embodiments, the booster amplifier may be configured to reduce the time and computation resources, among other things, in performing an additional oscillation detection method by using the power samples previously collected for the power-ratio oscillation detection. For example, FIG. 5D illustrates a method of detecting oscillations that may not result in false positive detections of oscillation, which may be referred to herein as amplification-adjust oscillation detection.

FIG. 5D illustrates that a first power measurement of a signal is taken while a first amplification factor is applied to the signal and, after applying a second application factor to the signal, taking a second power measurement of the signal. After the power-ratio oscillation detection method detects an oscillation, the amplification-adjust oscillation detection method may use the power samples collected during the power-ratio oscillation detection method in place of measuring the power of a signal while a first amplification factor is applied.

In these and other embodiments, after the power-ratio oscillation detection method determines that the booster amplifier is oscillating, the amplification-adjust oscillation detection method may adjust the amplification factor being applied to a signal and measure the power of the signal at the adjusted amplification factor. The amplification-adjust oscillation detection method may then compare a power of the signal determined by the power-ratio oscillation detection method with the power of the signal at the adjusted amplification factor to verify that the booster amplifier is oscillating.

When the power of the signal at the adjusted amplification factor is significantly less than the power of the signal determined by the power-ratio oscillation detection method, the oscillation of the booster amplifier may be verified. In some embodiments, oscillations of the booster amplifier being indicated by the power of the signal at the adjusted amplification factor being significantly less than the power of the signal determined by the power-ratio oscillation detection method may be true when the power of the signal is measured before the adjusted amplification factor is applied to the signal. When the power of the signal is measured after the adjusted amplification factor is applied to the signal, a difference between the power of the signal at the adjusted amplification factor to the power of the signal determined by the power-ratio oscillation detection method that is not significantly less may indicate oscillation of the booster amplifier. Thus, different booster amplifiers may rely on different differences between the power of the signal at the adjusted amplification factor and the power of the signal determined by the power-ratio oscillation detection method to determine oscillations. However, these different differences between the power of the signal used to determine oscillations may be related to the different locations in the booster amplifier where the power of the signal is measured and not to the booster amplifier performing different methods for determining oscillations of the booster amplifier.

In some embodiments, when a difference between the power of the signal at the adjusted amplification factor and the power of the signal determined by the power-ratio oscillation detection method is greater than the adjustment made to the amplification factor applied to the signal, the oscillation of the booster amplifier may be verified. When the oscillation of the booster amplifier is verified, steps may be taken to reduce or eliminate the oscillation of the booster amplifier as described herein.

Note that in some embodiments, an amount that the amplification-adjust oscillation detection method may adjust an amplification factor being applied to a signal and measure the power of the signal at the adjusted amplification factor may not be sufficient to stop oscillation of a booster amplifier. For example, a booster amplifier may be applying an amplification factor of 70 dB to a signal. Oscillations may occur in the booster amplifier when the booster amplifier applies an amplification of 30 dB or greater to a signal. As a result, if the amplification-adjust oscillation detection method adjust the amplification factor by lowering the amplification factor by less than 40 dB, the oscillation may continue. As a result, the power of the signal at the adjusted amplification factor and the power of the signal determined by the power-ratio oscillation detection method may not be significantly different as to indicate an oscillation as when the adjusted amplification factor is lowered below the 30 dB threshold for oscillation.

Thus, the amplification-adjust oscillation detection method may render a false negative by indicating that the booster amplifier is not oscillating when the booster amplifier is oscillating. Note that the amplification-adjust oscillation detection method may not render false negatives if the adjusted amplification factor is less than the smallest adjusted amplification factor that may result in external oscillations. In some embodiments, the smallest adjusted amplification factor that may result in external oscillations may be approximately equal to the smallest path loss between antennas attached to the booster amplifier. In some embodiments, the smallest path loss may be approximately 5 dB or less.

However, in some embodiments, it may be advantageous to adjust the amplification factor in the amplification-adjust oscillation detection method so that the adjusted amplification factor is greater than the smallest path loss between antennas attached to the booster amplifier or approximately 5 dB to reduce the amount of adjustment of the amplification factor in the amplification-adjust oscillation detection method. Reducing the amount of adjustment of the amplification factor may reduce noise created by the booster amplifier. For example, the amplification factor may be adjusted down 5, 10, 15, or 20 dB, during the amplification-adjust oscillation detection method.

Limiting the adjustment to the amplification factor during the amplification-adjust oscillation detection method may generate a false negative as noted. To compensate for the possibility of false negatives, the power-ratio oscillation detection method may be performed a second time. In some embodiments, the second iteration of the power-ratio oscillation detection method may be performed after the amplification-adjust oscillation detection method is performed where the adjusted amplification factor is less than or equal to the smallest path loss between antennas attached to the booster amplifier. Alternately or additionally, the second iteration of the power-ratio oscillation detection method may be performed after the amplification adjust oscillation detection method is performed, where the adjusted amplification factor is less than or equal to the smallest path loss between antennas attached to the booster amplifier, when the amplification adjust oscillation detection method is inconclusive. The amplification adjust oscillation detection method may be inconclusive when a difference between the power of the signal at the adjusted amplification factor and the power of the signal determined by the power-ratio oscillation detection method is not approximately equal to the amount of the adjustment of the amplification factor. In some embodiments, when the amplification adjust oscillation detection method conclusively indicates an oscillation, a second iteration of the power-ratio oscillation detection method may not be performed. The amplification adjust oscillation detection method may be conclusive when a difference between the power of the signal at the adjusted amplification factor and the power of the signal determined by the power-ratio oscillation detection method is approximately equal to the amount of the adjustment of the amplification factor.

The second iteration of the power-ratio oscillation detection method may sample the signal to obtain new power samples of the signal to perform the power-ratio oscillation detection method. In these and other embodiments, the second iteration of the power-ratio oscillation detection method may sample the signal more than the signal is sampled during the first iteration of the power-ratio oscillation detection method. For example, in some embodiments, the signal may be sampled 2 to 10 times more than during the first iteration. For example, during the first iteration, the signal may be sampled 200 times and during the second iteration the signal may be sampled 1000 times. In these and other embodiments, the second iteration of the power-ratio oscillation detection method may also render a false positive. However, a false positive is more acceptable than a false negative, as rendered by the amplification-adjust oscillation detection method, because a false positive does not allow for the booster amplifier to continue oscillating and cause interference with other wireless communications. Furthermore, sampling the signal multiple times more during the second iteration than the first iteration of the power-ratio oscillation detection method may result in less false positives. When the second iteration of the power-ratio oscillation detection method indicates that the booster amplifier is oscillating, the booster amplifier may take appropriate action as described herein.

Figure 11:
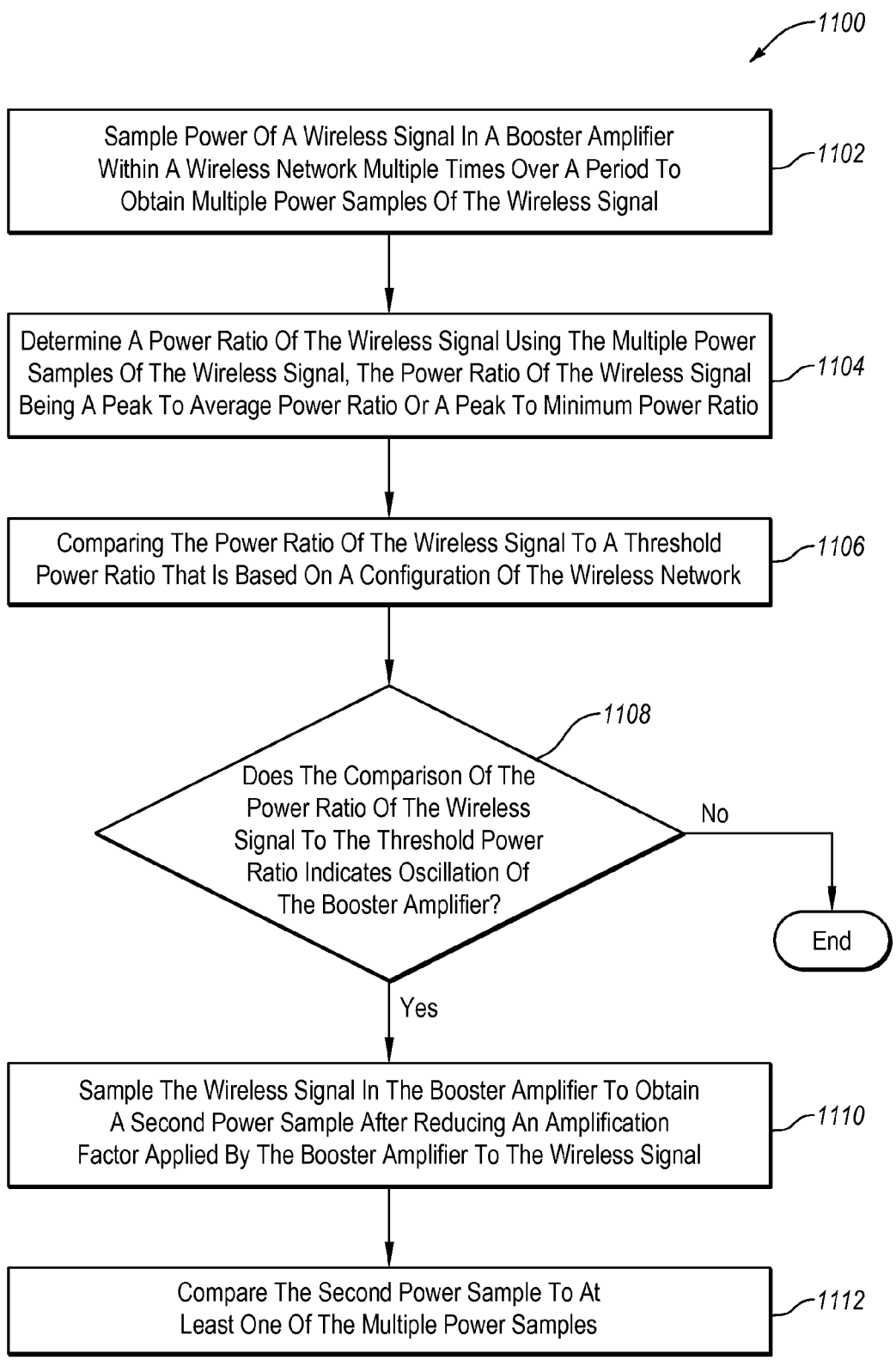
FIG. 11 is a flow chart of an example method of managing oscillations of a booster amplifier.

FIG. 11 is a flow chart of an example method 1100 of managing oscillations of a booster amplifier in a wireless network, arranged in accordance with at least some embodiments described herein. The method 1100 may be implemented, in some embodiments, by a booster amplifier, such as the booster amplifier 302 or 402 of FIGS. 3 and 4, respectively. For instance, the control circuit 314 of the booster amplifier 302 of FIG. 3 may be configured to execute computer instructions to perform operations for managing oscillations of the booster amplifier 302 as represented by one or more of blocks 1102, 1104, 1106, 1108, 1110, and 1112 of the method 1100. Although illustrated as discrete blocks, various blocks may be divided into additional blocks, combined into fewer blocks, or eliminated, depending on the desired implementation.

The method 1100 may begin at block 1102, where power of a wireless signal in a booster amplifier within a wireless network may be sampled multiple times over a period to obtain multiple power samples of the wireless signal. In some embodiments, the method 1100 may include receiving the wireless signal at the booster amplifier.

In some embodiments, the power of the wireless signal may be sampled at an input to an amplifier chain within the booster amplifier, an output to the amplifier chain, or within the amplifier chain. In these and other embodiments, the amplifier chain may include at least one amplifier and may be configured to apply the amplification factor to the wireless signal.

In block 1104, a power ratio of the wireless signal may be determined using the multiple power samples of the wireless signal. For example, the power ratio of the wireless signal may be a peak to average power ratio (PAPR) or a peak to minimum power ratio. In some embodiments, the power ratio of the wireless signal may be based on one or more of a peak power of the wireless signal during the period, a minimum power of the wireless signal during the period, a medium power of the wireless signal during the period, a root mean square of the wireless signal during the period, and a mean power of the wireless signal during the period, among others.

In block 1106, the power ratio of the wireless signal may be compared to a threshold power ratio that is based on a configuration of the wireless network. For example, if the wireless network is a CDMA network, the threshold power ratio may be based on a CDMA PAPR. In particular, the threshold power ratio may be determined based on signaling power ratios of wireless signal being communicated in the wireless network.

In block 1108, it may be determined when the comparison of the power ratio of the wireless signal to the threshold power ratio indicates oscillation of the booster amplifier. In some embodiments, the power ratio of the wireless signal being below the threshold power ratio may indicate oscillation of the booster amplifier. When the comparison of the power ratio of the wireless signal to the threshold power ratio indicates oscillation, block 1108 may be followed by blocks 1110 and 1112. When the comparison of the power ratio of the wireless signal to the threshold power ratio does not indicate oscillation, the method 1100 may end.

In block 1110, the wireless signal in the booster amplifier may be sampled to obtain a second power sample after reducing an amplification factor applied by the booster amplifier to the wireless signal. In some embodiments, the amplification factor may be greater than one after being reduced.

In block 1112, the second power sample may be compared to at least one of the multiple power samples. In some embodiments, the second power sample may be compared to an average of one or more of the multiple power samples, a highest of the multiple power samples, the lowest of the multiple power samples, or some other subset of the multiple power samples. In some embodiments, a third power sample may be obtained. In these and other embodiments, the second power sample may be compared to the third power sample.

In some embodiments, the booster amplifier may be verified to be oscillating when the second power sample is significantly less than one of the multiple power samples. In some embodiments, the booster amplifier may be verified to be oscillating when a difference between the second power sample and the one of the multiple power samples is larger than the reduction of the amplification factor applied by the booster amplifier to the wireless signal. In some embodiments, where the reduction in the amplification factor does not approach the smallest path loss between antennas attached to the booster amplifier or 5 dB or less, for example when the reduction in the amplification factor is approximately 3 to 30 dB, the second power sample may not be significantly less than the one of the multiple power samples, but the booster amplifier may be oscillating. Whether the amplification factor approaches or is smaller than the smallest path loss between antennas attached to the booster amplifier or 5 dB or less may vary depending of the booster amplifier and the configuration of antennas attached to the booster amplifier.

In these and other embodiments, comparing the second power sample to the one of the multiple power samples may not verify oscillation of the booster amplifier. To verify the oscillation of the booster amplifier, the method 500 may include resampling power of the wireless signal in the booster amplifier a second multiple of times over a second period to obtain a second multiple of power samples of the wireless signal and determining a second power ratio of the wireless signal using the second multiple of power samples of the wireless signal. The method 500 may further include comparing the second power ratio of the wireless signal to the threshold power ratio. In these and other embodiments, the comparing the second power ratio to the threshold power ratio may verify oscillation of the booster amplifier.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, the method 1100 may further include reducing the amplification factor applied by the booster amplifier to the wireless signal to be less than one when the booster amplifier is verified to be oscillating.

In some embodiments, when the oscillation of the booster amplifier is not verified, the method 1100 may further include increasing the amplification factor applied by the booster amplifier to the wireless signal. In some embodiments, when it is determined that the detected oscillation is not an oscillation but a false positive, the method 1100 may include increasing the amplification factor an amount that the amplification factor was reduced.

By detecting oscillations and reducing an amplification factor to stop current oscillations or to prevent oscillations, noise generated by a booster amplifier may be reduced. Reducing noise generated by a booster amplifier may help to reduce the noise floor of the network system in which the booster amplifier is operating. Reducing the noise floor of a network system or maintaining a low noise floor in a network system may be advantageous to a network system.

Noise generated by a booster amplifier may be further reduced by applying an amplification factor to a signal that is not significantly close to an amplification factor that causes oscillation of the booster amplifier. An amplification factor that causes oscillation of a booster amplifier may be referred to herein as an oscillation amplification factor. An amplification factor applied by a booster amplifier may be referred to herein as an applied amplification factor.

When an applied amplification factor of a booster amplifier approaches an oscillation amplification factor of the booster amplifier, the noise output by the booster amplifier may increase. For example, when an applied amplification factor is near to an oscillation amplification factor so that a difference between the amplification factors results in one dB of amplification, the difference in noise output by the booster amplifier may be twenty to thirty dB. In comparison, when a difference between an applied amplification factor and an oscillation amplification factor results in three dB of amplification, the difference in noise output by the booster amplifier may be six to eight decibels. Thus, it may be advantageous to maintain an amplification factor margin between an applied amplification factor and an oscillation amplification factor of a booster amplifier.

An amount of an amplification factor margin selected for a booster amplifier may vary based on the booster amplifier, a network in which the booster amplifier may operate, a desired noise floor, among other factors. In some embodiments, the amplification factor margin may result in an amplification margin of 1, 2, 3, 4, 5, 6, 7, 8, 9, 10. 12, or 15 decibels.

A booster amplifier may be configured to establish and maintain at least an amplification factor margin between the booster amplifier's applied amplification factor and the booster amplifiers' oscillation amplification factor. Note that under certain circumstances, a booster amplifiers' oscillation amplification factor may vary. A booster amplifiers' oscillation amplification factor may vary based on an environment external to the booster amplifier and changing conditions within the external environment. In particular, a booster amplifiers' oscillation amplification factor may vary based on changing path loss conditions within the external environment. As a result, to maintain an amplification factor margin between a booster amplifier's applied amplification factor and the booster amplifiers' oscillation amplification factor, the booster amplifier may periodically or continually adjust the booster amplifiers' applied amplification factor.

As an example, in some embodiments, a booster amplifier may detect changes in the booster amplifiers' oscillation amplification factor every three seconds. In some embodiments, the time between checking for changes in a booster amplifiers' oscillation amplification factor may be more or less than every three seconds. In some embodiments, the frequency of detecting changes in a booster amplifiers' oscillation amplification factor may depend on factors such as the use of the booster amplifier (e.g., within a moving vehicle versus a stationary building) and the sensitivity of the network, in which the booster amplifier operates, to noise. The use of the booster amplifier may be significant because it may affect how often path loss conditions surrounding the booster amplifier are changing and thereby affect the booster amplifiers' oscillation amplification factor.

An example booster amplifier configured to detect an oscillation amplification factor and to adjust an applied amplification factor based on an amplification factor margin may be described with respect to FIG. 4 and the booster amplifier 400.

For example, in some embodiments, the booster amplifier 400 may be configured to establish and to maintain at least an amplification factor margin between the booster amplifier's 400 applied amplification factor and the booster amplifiers' 400 oscillation amplification factor.

The booster amplifier 400 may have a particular amplification factor margin that may be used by the booster amplifier 400. In some embodiments, the amplification factor margin may be set. In some embodiments, the amplification factor margin may vary based on a network in which the booster amplifier 400 is operating. For example, some networks may tolerate more noise than other networks and thereby may allow for smaller amplification factor margins that may result in greater noise being generated by the booster amplifier 400. In some embodiments, the amplification factor margin may also be based on a distance between the booster amplifier 400 and a base station, where signals from the base station are amplified by the booster amplifier 400. In these and other embodiments, when the booster amplifier 400 is further from the base station, the amplification factor margin may be smaller than if the booster amplifier 400 is closer to the base station. Thus, in some embodiments, the amplification factor margin may vary during operation of the booster amplifier 400 based on one or more factors associated with the wireless network in which the booster amplifier 400 is operating. For example, the booster amplifier 400 may calculate an approximate distance between the booster amplifier 400 and the base station as described previously and set the amplification factor margin based on the calculated distance and/or other factors, such as the type of network in which the booster amplifier 400 is operating.

The microcontroller 414 may be configured to perform operations based on instructions within a computer readable medium to establish and/or to maintain an amplification factor margin between the booster amplifier's 400 applied amplification factor and the booster amplifiers' 400 oscillation amplification factor.

After the booster amplifier 400 commences operations and is applying an applied amplification factor to a signal, the microcontroller 414 may be configured to establish an amplification factor margin. To establish the amplification factor margin, the microcontroller 414 may direct the amplification control circuit 412 to increase the amplification factor being applied by the amplifier chain 404 to the signal by the amplification factor margin. With the increased amplification factor being applied to the signal, the oscillation detector 410 may detect if an oscillation is occurring at the increased amplification factor. The oscillation detector 410 may apply any one of the multiple methods described herein or any combination of the methods described herein to detect oscillations in the booster amplifier 400. After detecting oscillations, in some embodiments, the booster amplifier 400 may stop applying the amplification factor margin to the signal so that just the applied amplification factor is being applied to a signal within the booster amplifier 400.

When no oscillations are detected, the microcontroller 414 may increase the applied amplification factor and direct the amplification control circuit 412 to apply the increased applied amplification factor to the signal by way of the amplifier chain 404. The microcontroller 414 may increase the applied amplification factor by an amount smaller than, equal to, or larger than the amplification factor margin.

The microcontroller 414 may then repeat the process by directing the amplification control circuit 412 to increase the amplification factor by the amplification factor margin and by directing the oscillation detector 410 to detect if oscillations are occurring, until an oscillation in the booster amplifier 400 occurs. Once an oscillation occurs, the microcontroller 414 may change the applied amplification factor to an applied amplification margin used previously or to some other value, or maintain the applied amplification factor.

As an example, an initial applied amplification factor may result in 40 dB of amplification and an amplification factor margin of 4 dB. In this example, the booster amplifier 400's oscillation amplification factor may be related to 47 dB of amplification. Further, in this example, the microcontroller 414 may increase the initial applied amplification factor so that the amplification applied by the booster amplifier 400 increases by 1 dB. Thus, the amplification applied by the applied amplification factor would increase from 40 dB to 41 dB to 42 dB and finally to 43 dB. At 43 dB, when the amplification factor margin (4 dB) is added to the applied amplification factor, oscillations may occur because the applied amplification factor plus the amplification factor margin may approximately equal the oscillation amplification factor (47 dB). To maintain the amplification factor margin between the applied amplification factor and the oscillation amplification factor, the applied amplification factor may be established so that 43 dB or less of amplification is applied to a signal.

When oscillations are detected after the booster amplifier commences operations and the increased amplification factor (e.g the applied amplification factor plus the amplification factor margin) is being applied to the signal, the microcontroller 414 may stop applying the amplification factor margin and decrease the applied amplification factor and direct the amplification control circuit 412 to apply the decreased applied amplification factor. The microcontroller 414 may decrease the applied amplification factor by an amount smaller than, equal to, or larger than the amplification factor margin.

The microcontroller 414 may then repeat the process by directing the amplification control circuit 412 to increase the decreased applied amplification factor by the amplification factor margin and checking for oscillations until oscillations in the booster amplifier 400 stop occurring. Once oscillations stop occurring when a decreased applied amplification factor and the amplification factor margin are applied, the microcontroller 414 may establish the decreased applied amplification factor as the applied amplification factor.

In some embodiments, when oscillations are detected, the microcontroller 414 may decrease the applied amplification factor a significant amount and then apply the process of increasing the applied amplification factor as discussed above until an applied amplification factor is determined with the particular amplification factor margin.

After establishing the amplification factor margin, the microcontroller 414 may be configured to maintain the amplification factor margin between the applied amplification factor and the oscillating amplification factor by periodically increasing the applied amplification factor by the amplification factor margin and responding accordingly when an oscillation is detected. In some embodiments, when oscillations are not detected after a certain period, the microcontroller 414 may increase the applied amplification factor to determine if the oscillation amplification factor has been increased to allow an increase in the applied amplification factor while still maintaining the amplification factor margin.

In some embodiments, after the booster amplifier 400 commences operations and is applying an applied amplification factor to a signal, the microcontroller 414 may be configured to establish an amplification factor margin by checking for oscillations. When oscillations are not occurring at the applied amplification factor, the booster amplifier 400 may reduce the applied amplification factor by the amplification factor margin and thereby establish the amplification factor margin. When oscillations are occurring at the applied amplification factor, the booster amplifier 400 may reduce the applied amplification factor. The booster amplifier 400 may reduce the applied amplification factor by a particular amount that is less than, greater than, or equal to the amplification factor margin. After reducing the applied amplification factor, the booster amplifier 400 may again attempt to establish the amplification factor margin by performing any one of the multiple methods of establishing an amplification factor margin discussed herein.

In some embodiments, the applied amplification factor determined based on the amplification factor margin may not be an amplification factor that is actually applied by the booster amplifier 400 to a signal. In these and other embodiments, the applied amplification factor may be a highest amplification factor that may be considered by the booster amplifier 400 for amplifying a signal. For example, the booster amplifier 400 may apply one or more other algorithms as discussed herein to determine an amplification factor to apply to a signal. The applied amplification factor may limit the amplification factor that may be selected by the booster amplifier 400 based on these other algorithms to prevent excess noise from being introduced into a network by the booster amplifier 400. In these and other embodiments, the booster amplifier 400 may select an applied amplification factor differently than explained here, but may still periodically and/or continually check that the amplification factor margin is being maintained as described herein.

Note that in some embodiments, the process of maintaining an amplification factor margin may occur less periodically than other processes performed by the booster amplifier 400. For example, the booster amplifier 400 may perform oscillation detection as described herein with respect to FIGS. 5A-5E once every thirty milliseconds. In contrast, maintaining or establishing an amplification factor margin may occur once every three seconds. In some embodiments, maintaining or establishing an amplification factor margin may be performed in conjunction with the oscillation detection described herein with respect to FIGS. 5A-5E. For example, every hundredth oscillation detection may be performed at a reduced or increased applied amplification factor used to maintain or establish an amplification factor margin.

As an example, an initial applied amplification factor may result in 40 dB of amplification and an amplification factor margin, when applied, may result in 4 dB of additional amplification. In this example, the booster amplifier 400's oscillation amplification factor may be related to 45 dB of amplification. Further, in this example, the microcontroller 414 may increase the initial applied amplification factor (40 dB) by the amplification factor margin (4 dB) and check for oscillations. When no oscillations occur, the microcontroller may stop applying the amplification factor margin and may increase the amplified amplification factor so that the amplification applied by the booster amplifier 400 increases by 1 dB to 41 dB. Note that in some embodiments, the microcontroller 410 may perform the stopping the application of the amplification factor margin and the increasing the amplified amplification factor in a single step. For example, the microcontroller 410 may just decrease the amplification applied to a signal to 41 dB instead of decreasing to 40 dB and then increasing to 41 dB.

After a time period, such as two seconds, the microcontroller may increase the applied amplification factor (41 dB) by the amplification factor margin (4 dB) and check for oscillations. At 41 dB, when the amplification factor margin (4 dB) is added to the applied amplification factor, oscillations may occur because the applied amplification factor plus the amplification factor margin may approximately equal the oscillation amplification factor (45 dB). To maintain the amplification factor margin between the applied amplification factor and the oscillation amplification factor, the applied amplification factor may be established so that less than 41 dB of amplification is applied to a signal.

Note that the amplification factor margin discussed herein, in some embodiments, may be a desired amplification factor margin for the booster amplifier. In these and other embodiments, the actual amplification factor margin between the applied amplification factor and the oscillation amplification factor may vary due to various reasons, such as changing environmental conditions.

Modifications, additions, or omissions may be made to the booster amplifier 400 without departing from the scope of the present disclosure. For example, the oscillation detector 410 and the microcontroller 414 may be combined in a single unit. Alternately or additionally, the microcontroller 414 may be configured to perform other process for managing oscillations amplification factors than those described.

Figure 12:
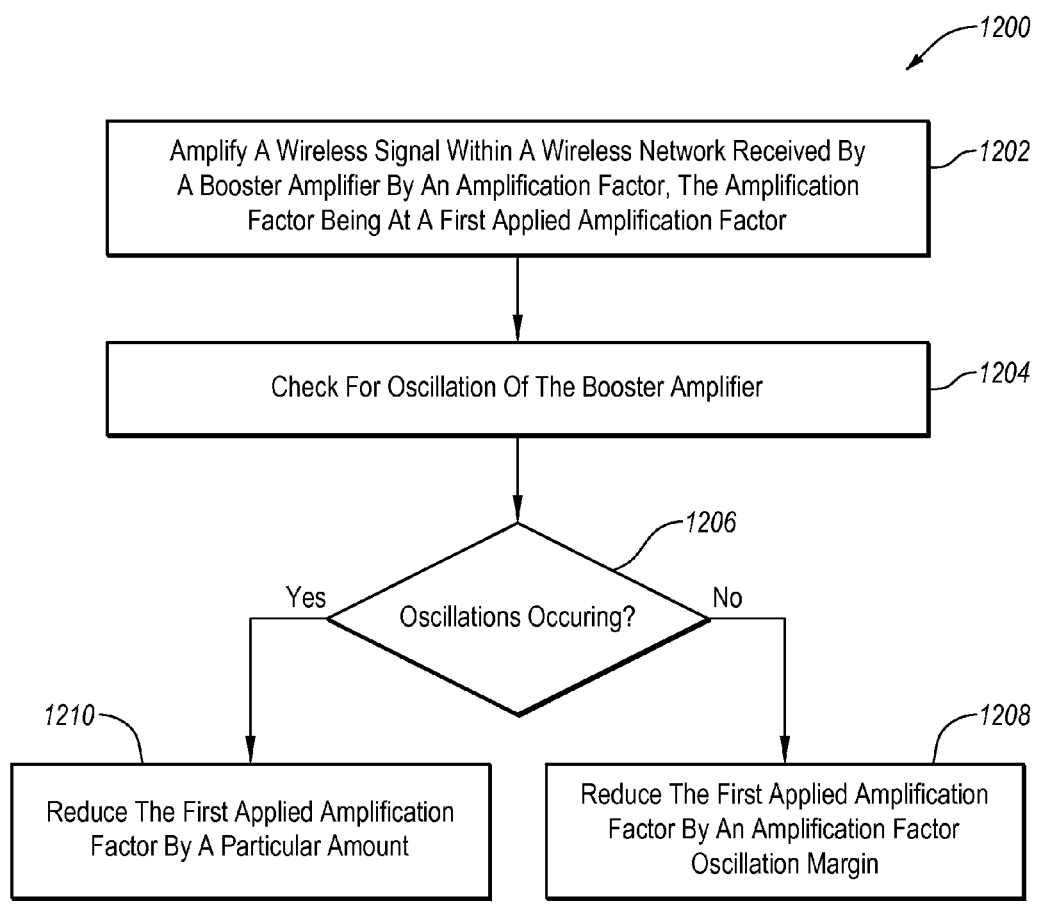
FIGS. 12-14 are flow charts of example methods of determining an oscillation amplification factor margin of a booster amplifier.

FIG. 12 is a flow chart of an example method 1200 of managing an oscillation amplification factor margin of a booster amplifier in a wireless network, arranged in accordance with at least some embodiments described herein. The method 1200 may be implemented, in some embodiments, by a booster amplifier, such as the booster amplifier 400 of FIG. 4. For instance, the microcontroller 414 of the booster amplifier 400 of FIG. 4 may be configured to execute computer instructions to perform operations for detecting and managing an oscillation amplification factor margin of the booster amplifier 400 as represented by one or more of blocks 1202, 1204, and 1206 of the method 1200. Although illustrated as discrete blocks, various blocks may be divided into additional blocks, combined into fewer blocks, or eliminated, depending on the desired implementation.

The method 1200 may begin at block 1202, where a wireless signal within a wireless network received by a booster amplifier may be amplified by an amplification factor. In particular, the amplification factor applied by the booster amplifier may be a first applied amplification factor. In some embodiments, the first applied amplification factor may not cause oscillation in the booster amplifier.

In block 1204, it may be determined if the booster amplifier is oscillating by checking for oscillations of the booster amplifier. In block 1206, it may be determined if oscillations of the booster amplifier are occurring. When oscillations are occurring in the booster amplifier, block 1206 may be followed by block 1210. When oscillations are not occurring in the booster amplifier, block 1206 may be followed by block 1208.

In block 1208, the first applied amplification factor may be reduced by an amplification factor oscillation margin. In some embodiments, the amplification factor oscillation margin may result in at least an amplification oscillation margin of three decibels.

In block 1210, the first applied amplification factor may be reduced by a particular amount. In some embodiments, the particular amount may be greater than, less than, or equal to the amplification factor oscillation margin.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, the method 1200 may further include setting the amplification factor to the first applied amplification factor to maintain the amplification factor oscillation margin. In some embodiments, the method 1200 may further include maintaining at least the amplification factor oscillation margin between the amplification factor and an oscillation amplification factor that causes oscillations in the booster amplifier.

In some embodiments, when the particular amount is greater than the amplification factor oscillation margin, the method 1200 may further include checking for oscillation of the booster amplifier when the amplification factor is at a second applied amplification factor less than the first applied amplification factor. When the booster amplifier is not oscillating, the method 1200 may further include increasing the amplification factor by the amplification factor oscillation margin and rechecking for oscillation of the booster amplifier after the increasing the amplification factor. In some embodiments, the second applied amplification factor may be greater than the first applied amplification factor reduced by the particular amount.

In some embodiments, checking for oscillation of the booster amplifier may further include sampling power of the wireless signal in the booster amplifier multiple times over a period to obtain multiple power samples of the wireless signal and determining a power ratio of the wireless signal using the multiple power samples of the wireless signal. Checking for oscillation of the booster amplifier may further include comparing the power ratio of the wireless signal to a threshold power ratio that is based on a configuration of the wireless network. Other methods of detecting oscillations of the booster amplifier as disclosed herein may also be used.

Figure 13:
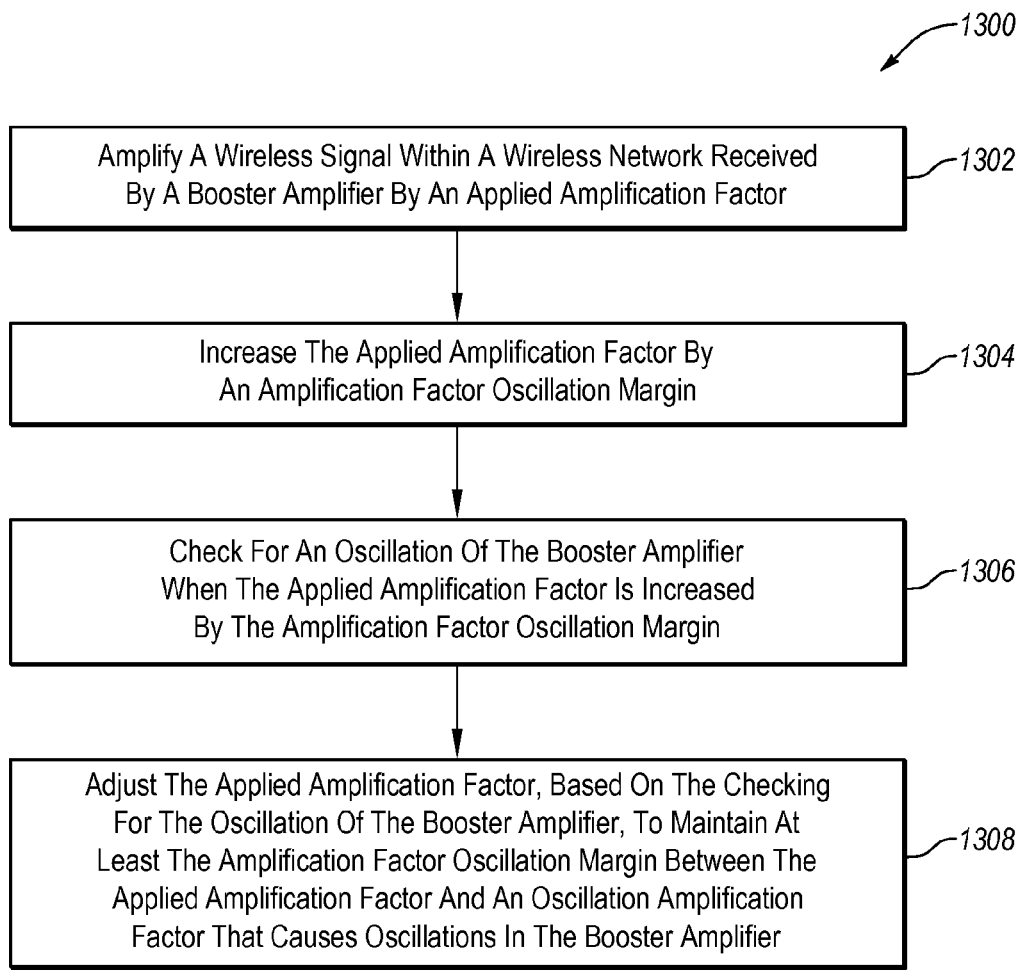

FIG. 13 is a flow chart of another example method 1300 of managing an oscillation amplification factor margin of a booster amplifier in a wireless network, arranged in accordance with at least some embodiments described herein. The method 1300 may be implemented, in some embodiments, by a booster amplifier, such as the booster amplifier 400 of FIG. 4. For instance, the microcontroller 414 of the booster amplifier 400 of FIG. 4 may be configured to execute computer instructions to perform operations for managing an oscillation amplification factor margin of the booster amplifier 400 as represented by one or more of blocks 1302, 1304, 1306, and 1308 of the method 1300. Although illustrated as discrete blocks, various blocks may be divided into additional blocks, combined into fewer blocks, or eliminated, depending on the desired implementation.

The method 1300 may begin at block 1302, where a wireless signal within a wireless network received by a booster amplifier may be amplified by an applied amplification factor. In block 1304, the applied amplification factor may be increased by an amplification factor oscillation margin. In some embodiments, the amplification factor oscillation margin may result in at least an amplification oscillation margin of three decibels.

In block 1306, it may be determined if the booster amplifier is oscillating when the applied amplification factor is increased by the amplification factor oscillation margin by checking for oscillations of the booster amplifier. In block 1308, the applied amplification factor may be adjusted based on whether the booster amplifier is oscillating to maintain at least the amplification factor oscillation margin between the applied amplification factor and an oscillation amplification factor that causes oscillations in the booster amplifier.

In some embodiments, when the booster amplifier is oscillating the applied amplification factor may be decreased. In some embodiments, the applied amplification factor may be decreased by less than the amplification factor oscillation margin. In some embodiments, the applied amplification factor may be decreased by more than the amplification factor oscillation margin.

In some embodiments, when the booster amplifier is not oscillating, the applied amplification factor may be increased. In some embodiments, the increase in the applied amplification factor may be less than the amplification factor oscillation margin.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, detecting oscillation of the booster amplifier may further include sampling power of the wireless signal in the booster amplifier multiple times over a period to obtain multiple power samples of the wireless signal and determining a power ratio of the wireless signal using the multiple power samples of the wireless signal. Detecting oscillation of the booster amplifier may further include comparing the power ratio of the wireless signal to a threshold power ratio that is based on a configuration of the wireless network. Other methods of detecting oscillations of the booster amplifier as disclosed herein may also be used.

Figure 14:
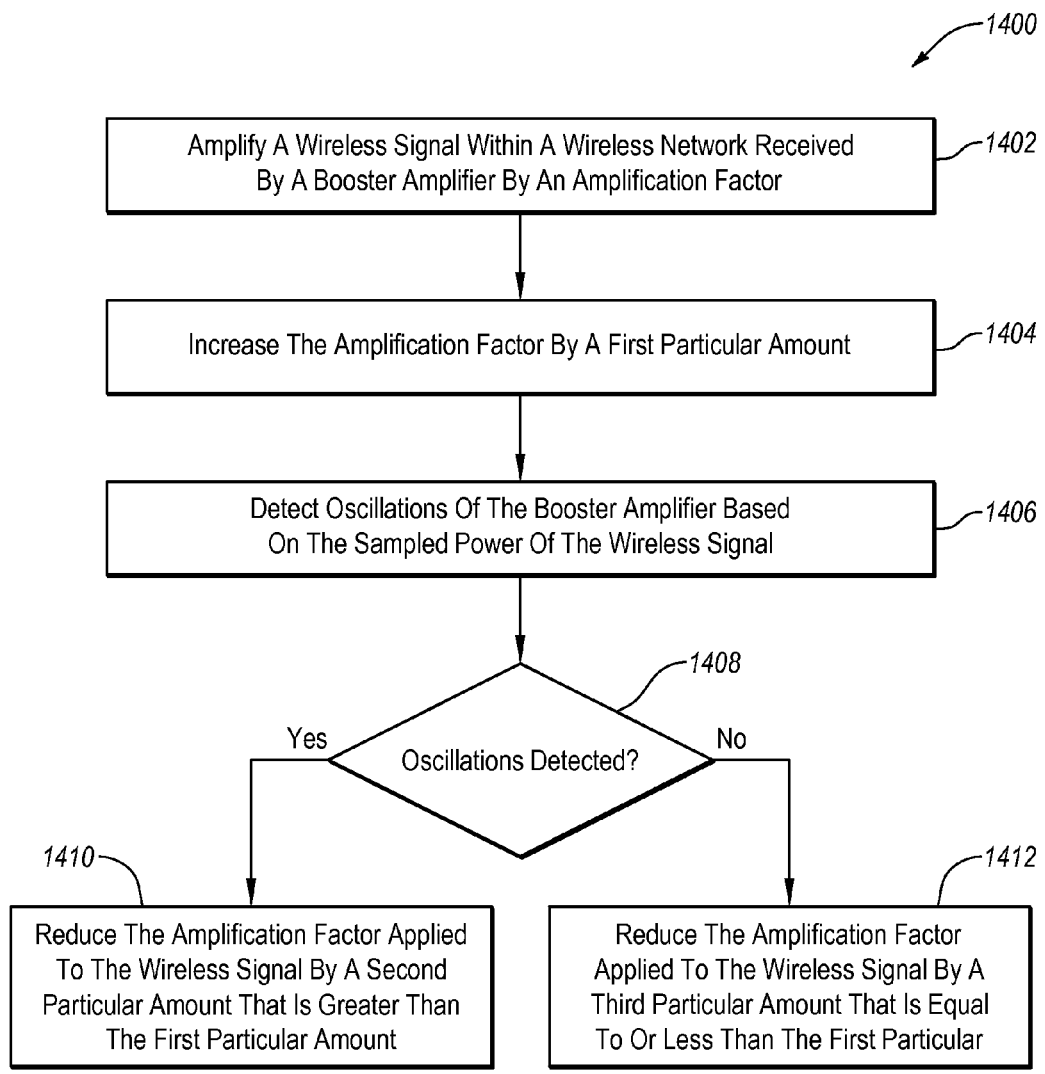

FIG. 14 is a flow chart of another example method 1400 of determining an oscillation amplification factor margin of a booster amplifier in a wireless network, arranged in accordance with at least some embodiments described herein. The method 1400 may be implemented, in some embodiments, by a booster amplifier, such as the booster amplifier 400 of FIG. 4. For instance, the microcontroller 414 of the booster amplifier 400 of FIG. 4 may be configured to execute computer instructions to perform operations for managing an oscillation amplification factor margin of the booster amplifier 400 as represented by one or more of blocks 1402, 1404, 1406, 1408, 1410, and 1412 of the method 1400. Although illustrated as discrete blocks, various blocks may be divided into additional blocks, combined into fewer blocks, or eliminated, depending on the desired implementation.

The method 1400 may begin at block 1402, where a wireless signal within a wireless network received by a booster amplifier may be amplified by an amplification factor. In block 1404, the amplification factor may be increased by a first particular amount. The first particular amount may amount to an amplification of at least three decibels in the booster amplifier. In some embodiments, increasing the amplification factor by the first particular amount may occur periodically.

In some embodiments, the first particular amount may be an amplification factor margin between an operational amplification factor of the booster amplifier and an oscillation amplification factor of the booster amplifier. The oscillation amplification factor of the booster amplifier may be an amplification factor that causes the booster amplifier to oscillate. The operational amplification factor of the booster amplifier may be an amplification factor that the booster amplifier applies a majority of the time to a signal. Note that the operational amplification factor of the booster amplifier may be adjusted periodically based on factors within the network as disclosed herein and for other reasons.

In block 1406, oscillations of the booster amplifier when occurring may be detected based on the sampled power of the wireless signal.

In block 1408, it may be determined if oscillations of the booster amplifier occur when the amplification factor is increased by the first particular amount. When oscillations are occurring in the booster amplifier due to the increase in the amplification factor by the first particular amount, block 1408 may be followed by block 1410. When oscillations are not occurring in the booster amplifier due to the increase in the amplification factor by the first particular amount, block 1408 may be followed by block 1412.

In block 1410, the amplification factor applied to the wireless signal may be reduced by a second particular amount that is greater than the first particular amount. In block 1412, the amplification factor applied to the wireless signal may be reduced by a third particular amount that is equal to or less than the first particular amount.

The embodiments of the present invention may comprise a special purpose or general-purpose computing device including various computer hardware. The control circuit or other processor included in embodiments of a booster amplifier are examples of a computing device.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise random access memory (RAM), read only memory (ROM), electronic erasable programmable read only memory (EEPROM), compact disk read only memory (CD-ROM) or other optical disk storage, magnetic disk storage or other magnetic storage devices, or any other medium which can be used to carry or store desired program code means in the form of computer-executable instructions or data structures and which can be accessed by a general purpose or special purpose computer. Combinations of the above should also be included within the scope of computer-readable media. Computer-executable instructions comprise, for example, instructions and data which cause a general purpose computer, special purpose computer, or special purpose processing device to perform a certain function or group of functions.

The following discussion is intended to provide a brief, general description of a suitable computing environment in which the invention may be implemented. Although not required, the invention may be described in the general context of computer-executable instructions, such as program modules, being executed by computers in network environments. Generally, program modules include routines, programs, objects, components, data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Those skilled in the art will appreciate that the invention may be practiced in network computing environments with many types of computer system configurations, including personal computers, hand-held devices, multi-processor systems, microprocessor-based or programmable consumer electronics, network PCs, minicomputers, mainframe computers, and the like. The invention may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of determining an oscillation amplification margin of a booster amplifier within a wireless network, the method comprising:
    amplifying a wireless signal within a wireless network received by a booster amplifier by an amplification factor, the amplification factor being at a first applied amplification factor;
    checking for oscillation of the booster amplifier; and
    in response to checking for oscillation of the booster amplifier, reducing the first applied amplification factor, the reducing the first applied amplification factor including:
        reducing the first applied amplification factor by an amplification factor oscillation margin when the booster amplifier is not oscillating; and
        reducing the first applied amplification factor by a particular amount when the booster amplifier is oscillating.

2. The method of claim 1, wherein the particular amount is greater than, less than, or equal to the amplification factor oscillation margin.

3. The method of claim 1, wherein when the particular amount is greater than the amplification factor oscillation margin, the method further comprises:
    checking for oscillation of the booster amplifier when the amplification factor is at a second applied amplification factor less than the first applied amplification factor;
    when the booster amplifier is not oscillating, increasing the amplification factor by the amplification factor oscillation margin; and
    rechecking for oscillation of the booster amplifier after the increasing the amplification factor.

4. The method of claim 3, wherein the second applied amplification factor is greater than the first applied amplification factor reduced by the particular amount.

5. The method of claim 1, further comprising maintaining at least the amplification factor oscillation margin between the amplification factor and an oscillation amplification factor that causes oscillations in the booster amplifier.

6. The method of claim 1, wherein the amplification factor oscillation margin results in at least an amplification oscillation margin of three decibels.

7. The method of claim 1, further comprising setting the amplification factor to the first applied amplification factor to maintain the amplification factor oscillation margin.

8. The method of claim 1, wherein the amplification factor oscillation margin is varied based on one or more factors associated with the wireless network.

9. The method of claim 1, wherein checking for oscillation of the booster amplifier includes:
    sampling power of the wireless signal in the booster amplifier a plurality of times over a period to obtain a plurality of power samples of the wireless signal;
    determining a power ratio of the wireless signal using the plurality of power samples of the wireless signal; and
    comparing the power ratio of the wireless signal to a threshold power ratio that is based on a configuration of the wireless network.

10. A method of determining an oscillation amplification margin of a booster amplifier within a wireless network, the method comprising:
    amplifying a wireless signal within a wireless network received by a booster amplifier by an applied amplification factor;
    increasing the applied amplification factor by an amplification factor oscillation margin;

checking for an oscillation of the booster amplifier when the applied amplification factor is increased by the amplification factor oscillation margin; and adjusting the applied amplification factor based on whether the booster amplifier is oscillating when checked to maintain at least the amplification factor oscillation margin between the applied amplification factor and an oscillation amplification factor that causes oscillations in the booster amplifier.

11. The method of claim 10, wherein when checking for the oscillation of the booster amplifier indicates an oscillation of the booster amplifier, adjusting the applied amplification includes decreasing the applied amplification factor.

12. The method of claim 11, wherein the decrease in the applied amplification factor is less than the amplification factor oscillation margin.

13. The method of claim 11, wherein the decrease in the applied amplification factor is more than the amplification factor oscillation margin.

14. The method of claim 10, wherein when checking for the oscillation of the booster amplifier does not indicate oscillation of the booster amplifier, adjusting the applied amplification includes increasing the applied amplification factor.

15. The method of claim 14, wherein the increase in the applied amplification factor is less than the amplification factor oscillation margin.

16. The method of claim 10, wherein the amplification factor oscillation margin results in at least an amplification oscillation margin of three decibels.

17. The method of claim 10, wherein checking for the oscillation of the booster amplifier includes:

sampling power of the wireless signal within the booster amplifier a plurality of times over a period to obtain a plurality of power samples of the wireless signal;

determining a power ratio of the wireless signal using the plurality of power samples of the wireless signal; and comparing the power ratio of the wireless signal to a threshold power ratio that is based on a configuration of the wireless network.

18. A method of determining an oscillation amplification margin of a booster amplifier within a wireless network, the method comprising:

amplifying a wireless signal within a wireless network received by a booster amplifier by an amplification factor;

increasing the amplification factor by a first amount;

detecting whether oscillations of the booster amplifier are occurring when the amplification factor is increased by the first amount;

when oscillations of the booster amplifier occur when the amplification factor is increased by the first amount, reducing the amplification factor applied to the wireless signal by a second amount that is greater than the first amount; and when oscillations of the booster amplifier do not occur when the amplification factor is increased by the first amount, reducing the amplification factor applied to the wireless signal by a third amount that is equal to or less than the first amount.

19. The method of claim 18, wherein the first amount is an amplification factor margin that is between an operational amplification factor of the booster amplifier and an oscillation amplification factor of the booster amplifier.

20. The method of claim 18, wherein the first amount amounts to an amplification of at least three decibels.

* * * * *